United States Patent
Lee

(10) Patent No.: US 7,453,531 B2
(45) Date of Patent: Nov. 18, 2008

(54) LCD DRIVING DEVICE HAVING PLURAL TFT CHANNELS CONNECTED IN PARALLEL WITH EITHER INCREASING CHANNEL WIDTHS OR DECREASING CHANNEL DISTANCES FROM CENTRAL PART TO EDGES OF THE DEVICE

(75) Inventor: Seok Woo Lee, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 605 days.

(21) Appl. No.: 10/989,351

(22) Filed: Nov. 17, 2004

(65) Prior Publication Data

US 2005/0139835 A1 Jun. 30, 2005

(30) Foreign Application Priority Data

Nov. 22, 2003 (KR) .................... 10-2003-0083347
Nov. 22, 2003 (KR) .................... 10-2003-0083354

(51) Int. Cl.
*G02F 1/136* (2006.01)
(52) U.S. Cl. ....................... 349/43; 257/241
(58) Field of Classification Search ............... 349/42, 349/43; 257/72, 241
See application file for complete search history.

(56) References Cited

U.S. PATENT DOCUMENTS

| 5,235,448 | A | * | 8/1993 | Suzuki et al. ............... 349/43 |
| 6,118,148 | A | * | 9/2000 | Yamazaki ................. 257/327 |
| 7,132,690 | B2 | * | 11/2006 | Lee et al. ................... 257/72 |
| 2002/0190257 | A1 | * | 12/2002 | Yamazaki et al. ........... 257/72 |
| 2003/0209737 | A1 | * | 11/2003 | Mitani et al. ............. 257/241 |

FOREIGN PATENT DOCUMENTS

| JP | 10-270699 | 10/1998 |
| JP | 10270699 A | * 10/1998 |
| JP | 2001-305584 | 10/2001 |
| KR | 1020030087919 A | 11/2003 |

* cited by examiner

*Primary Examiner*—David C. Nelms
*Assistant Examiner*—John Heyman
(74) *Attorney, Agent, or Firm*—McKenna Long & Aldridge LLP

(57) ABSTRACT

There is disclosed a liquid crystal display device that is adaptive for preventing the driving device defect of a driving circuit part and a method of fabricating the same. A liquid crystal display device according to an embodiment of the present invention includes a driving device of a structure that a plurality of thin film transistor having a channel of poly silicon are connected in parallel, in a driving circuit, and wherein at least one of widths of the channels and distances between the adjacent channels is different in accordance with their location.

4 Claims, 26 Drawing Sheets

$D_{n/2} > \cdots > D_2 > D_1, D_{n/2} > \cdots > D_{n-1} > D_n$ $W_{n/2} > \cdots > W_2 > W_1, W_{n/2} > \cdots > W_{n-1} > W_n$

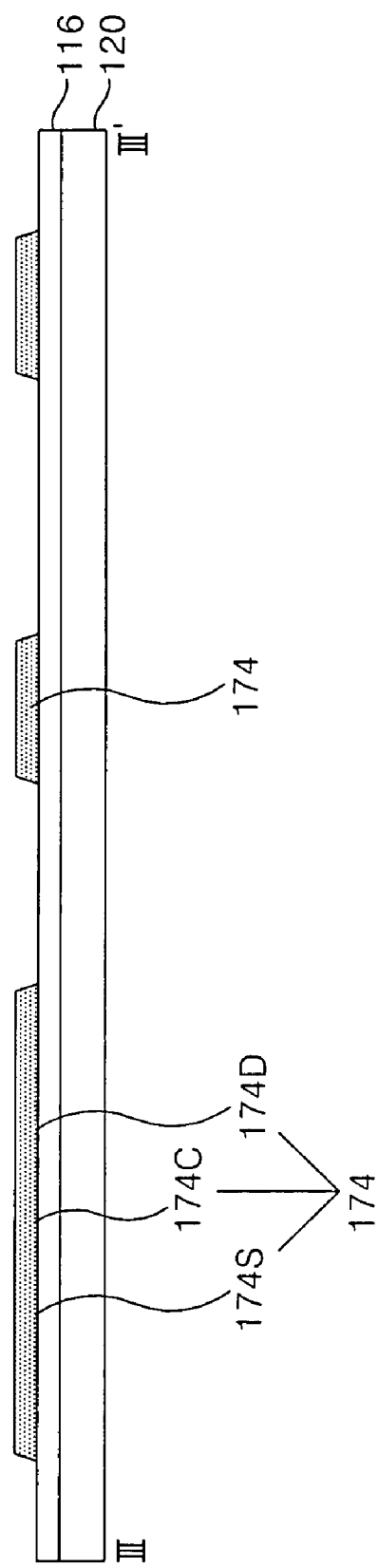

LCD DRIVING DEVICE HAVING PLURAL TFT CHANNELS CONNECTED IN PARALLEL WITH EITHER INCREASING CHANNEL WIDTHS OR DECREASING CHANNEL DISTANCES FROM CENTRAL PART TO EDGES OF THE DEVICE

This application claims the benefit of the Korean Patent Application Nos. P2003-83347 and P2003-83354 filed in Korea on Nov. 22, 2003 and Nov. 22, 2003, which are hereby incorporated by reference for all purposes as if fully set forth herein.

BACKGROUND OF THE INVENTION

1. Field of the Invention

The present invention relates to a liquid crystal display device, and more particularly to a liquid crystal display device that is able to prevent defects in a driving circuit and a method of fabricating the same.

2. Description of the Related Art

Generally, a liquid crystal display (LCD) controls the light transmissivity of liquid crystal cells arranged in a matrix in accordance with video signals to display a picture that corresponds to those video signals. A thin film transistor (TFT) is generally used as a device that switches the liquid crystal cells.

The thin film transistor used in the liquid crystal display device has its semiconductor layer made of amorphous silicon or poly silicon. The amorphous silicon type thin film transistor has an advantage that its characteristic because of the relatively high uniformity of the amorphous silicon film. However, the amorphous silicon type thin film transistor has a disadvantage that its response speed is slow because of low electric charge mobility. Accordingly, the amorphous silicon type thin film transistor has a disadvantage that it is not applicable as the driving device of a gate driver and a data driver of a high resolution display panel that requires rapid response speed.

The poly silicon type thin film transistor has high electric charge mobility so that it can have surrounding driving allowing it to be built into the display panel as well as being applicable to a high resolution display panel. Accordingly, the liquid crystal display device using the poly silicon type thin film transistor are becoming popular.

FIG. 1 is a plan view representing a liquid crystal display device using a poly silicon type thin film transistor according to the related art.

Referring to FIG. 1, a related art liquid crystal display device using a poly silicon type thin film transistor includes a picture display part 96 having a pixel matrix, a data driver 92 to drive data lines 4 of the picture display part 96, and a gate driver 92 to driver gate lines 2 of the picture display part 96.

The picture display part 96 has liquid crystal cells LC arranged in a matrix shape to display a picture. Each liquid crystal cell LC is driven by a thin film transistor TFT 30 switching device connected to a crossing of the gate line 2 and the data line 4, made of a poly silicon into which N-type impurities are injected.

The N-type TFT 30 responds to a scan pulse from the gate line 2 to charge the liquid crystal cell LC with a video signal, i.e., a pixel signal, from the data line 4. Accordingly, the liquid crystal cell LC controls the light transmissivity in accordance with the pixel signal with which the liquid crystal cell LC is charged.

The gate driver 94 sequentially drives the gate lines 2 for a horizontal period each frame by gate control signals. The gate driver 94 sequentially turns on the thin film transistors by the horizontal line to connect the data line 4 with the liquid crystal cell.

The data driver 92 takes samples of a plurality of digital data signals by the horizontal period to convert it into an analog data signal. And, the data driver 92 supplies the analog data signals to the data lines 4. Accordingly, the liquid crystal cells connected to the turned-on thin film transistor respond to the data signals from the data lines 4 to control the light transmissivity.

The gate driver 94 and the data driver 92 include a driving device connected in a CMOS structure. The driving device is a single large TFT that has a wide channel with width Wa in order to make a large amount of electric current flow for switching a relatively high voltage. The poly-silicon is used for such a driving device to obtain a rapid response.

FIG. 2 is a plan view representing a driving device of a driving circuit part according to the related art. FIG. 3 is a sectional view representing the driving device shown in FIG. 2.

Referring to FIGS. 2 and 3, a driving device of a driving circuit part having one thin film transistor includes an active layer 74 in which an purity, i.e., N+ ion or P+ ion, is injected formed on a lower substrate 20; a gate electrode 66 formed to overlap a channel area 74C of the active layer 74 with a gate insulating film 42 therebetween; source/drain electrodes 68, 70 formed to be insulated having the gate electrode 66 and an intermediate insulating film 56 therebetween; and a protective film formed on the source/drain electrodes 68, 70.

Each of the source/drain electrodes 68, 70 are in contact with the source/drain area 74S, 74D of the active layer 74 into which a designated impurity is injected through source/drain contract holes 84S, 84D that penetrate the gate insulating film 42 and the intermediate insulating film 56. The protective film 48 is formed on the source/drain electrodes 68/70 to play the role of protecting the driving device.

On the other hand, the driving device composed of one thin film transistor of the related art in this way has an advantage in that a lot of electric current can flow. However, a lot of heat is generated at the channel 57 due to the flow of electric current. Accordingly, a structure that can cool down the heat generated at the channel 57 is illustrated in FIG. 4, in which the driving device of the thin film transistors has a plurality of narrow channel widths Wb that are connected in parallel.

The driving device of the driving circuit part illustrated in FIG. 4 has a structure that the thin film transistors of a plurality of channels 77 are connected in parallel so that the sum of the channel widths Wb is the same as the width Wa of the one channel shown in FIG. 2 (small channel width (Wb)×the number of channels (n)=width of one channel (Wa)). Between the thin film transistors, there exist the gate insulating film 42 and the intermediate insulating film 56 between the two channels 77 as illustrated in FIG. 5. The heat generated at the channel 77 is transmitted by the gate insulating film 42 and the intermediate insulating film 56, and then it is emitted to the outside of the driving device.

However, the channel width Wb and the distance between channels D are uniform, so the amount of heat generated in the channel widths Wb is the same, but the heat emission is not greater in the channel 77 located at the central part of the driving device than in the channel 77 located at the edge, thus, as shown in FIG. 6, the heat distribution A is relatively higher in the channel 77 area of the central part of the driving device than in the channel 77 area of the edge. In other words, the amount of the gate insulating film 42 and the intermediate insulating film 56, which the heat is transmitted through and emitted from, in the edge of the driving device is greater than in the center thereof, thus further in from the edge of the driving device to the center, the smaller the heat emission capacity of the heat generated at the channel becomes.

Accordingly, the emission of the heat is worse in the channel 77 of the central part of the driving device of the driving circuit part than in the channel 77 at the edge thereof, thus the central part of the driving device deteriorates as illustrated in FIG. 7. As a result, driving device defects occur, e.g., the smooth flow of electric current is interfered or the characteristic of the driving device deteriorates. In general problems occur in which the driving device is not driven in a normal way.

Further, the LCD device has a structure in which the thin film transistor with a plurality of channel 77 are connected in parallel in order that the sum of the channel widths Wb is the same as the width Wa of one channel shown in FIG. 2 {small channel width (Wb)×the number of channels (n)=width of one channel (Wa)}. Between the thin film transistors, there are [the] gate insulating film 42 and the intermediate insulating film 56 between each of the channels 77 as illustrated in FIG. 5, so the heat generated at the channel 77 is absorbed by the gate insulating film 42 and the intermediate insulating film 56. The material of the gate insulating film 42 and the intermediate insulating film 56 is an insulating material such as SiO2 that has a low dielectric constant. This reduces the value of the parasitic capacitance generated between electrodes. But the insulating material, such as SiO2, has for example low heat conductivity of about 1.4 kW/mK. Accordingly, only part of the heat generated at the channel 77 is transmitted to the gate insulating film 42 and the intermediate insulating film 56; the remaining heat is not transmitted. As a result, the heat remaining at the channel 77 causes the channel to deteriorate. Thus, the flow of electric current degrades or the characteristic of the driving device deteriorates resulting in the defect of the driving device, thereby generating a problem that the driving device is not driven in a normal way.

SUMMARY OF THE INVENTION

Accordingly, it is an advantage of the present invention to provide to a liquid crystal display device that is adaptive for preventing the driving device defect of a driving circuit part and a method of fabricating the same.

In order to achieve these and other advantages of the invention, a liquid crystal display device according to an aspect of the present invention includes a driving device of a structure that a plurality of thin film transistor having a channel of poly silicon are connected in parallel in a driving circuit and wherein at least one of widths of the channels and distances between the adjacent channels is different in accordance with their location.

At least one of the width of the channel and the distance between the channels is changed gradually.

The distance between the channels is uniform, and the channel width broadens progressively from a central part of the driving device to the edge thereof.

The channel width is uniform, and the distance between the channels narrows from a central part of the driving device to the edge thereof.

The driving device includes: an active layer formed to have a plurality of channels on a buffer film that is formed on a substrate; a gate electrode formed to overlap with the active layer and a gate insulating film therebetween; and a source electrode and a drain electrode being in contact with the active layer with the gate electrode and a go-between insulating film therebetween.

A fabricating method of a liquid crystal display device according to another aspect of the present invention includes: forming in a driving circuit a driving device of a structure that a plurality of thin film transistors are connected in parallel, wherein the thin film transistor has a channel of poly silicon; and differently forming at least one of the widths of the channels and distances of the channels in accordance with their location.

In the fabricating method, at least one of the width of the channel and the distance of the channels is gradually changed.

In the fabricating method, the distance between the channels is uniform, and the channel width is formed to be broader as it goes from a central part of the driving device to the edge thereof.

In the fabricating method, the channel width is uniform, and the distance between the channels is formed to be narrower as it goes from a central part of the driving device to the edge thereof.

In the fabricating method, the step of forming the driving device includes: forming an active layer having a plurality of channels on a buffer film which is formed on a substrate; forming a gate electrode to overlap with the active layer and a gate insulating film therebetween; and forming a source electrode and a drain electrode being in contact with the active layer with the gate electrode and a go-between insulating film therebetween.

A liquid crystal display device according to still another aspect of the present invention includes a driving device of a structure that a plurality of thin film transistor having a channel of poly silicon are connected in parallel, in a driving circuit; and a heat conductive material formed between the adjacent channels of the driving device and close to the channel to transmit the heat generated at the channel.

The driving device includes: an active layer formed to have a plurality of channels which are formed on a buffer film that is formed on a substrate; a gate electrode formed to overlap with the active layer and a gate insulating film therebetween; and a source electrode and a drain electrode being in contact with the active layer with the gate electrode and a go-between insulating film therebetween.

The liquid crystal display device further includes a hole exposing at least one of a substrate and the buffer film between the adjacent channels.

The heat conductive material is in contact with the buffer film through the hole, and in addition, is formed on the entire surface of the driving device to protect the driving device.

The heat conductive material includes SiNx.

The heat conductive material has a heat conductivity of approximately 16 to 22 W/mK.

A fabricating method of a liquid crystal display device according to yet another aspect of the present invention includes: forming in a driving circuit a driving device of a structure that a plurality of thin film transistors are connected in parallel, wherein the thin film transistor has a channel of poly silicon; and forming a heat conductive material between the adjacent channels of the driving device and close to the channel, to absorb the heat generated at the channel.

In the fabricating method, the step of forming the driving device includes: forming an active layer having a plurality of channels on a buffer film which is formed on a substrate; forming a gate electrode to overlap with the active layer and a gate insulating film therebetween; and forming a source electrode and a drain electrode being in contact with the active layer with the gate electrode and a go-between insulating film therebetween.

In the fabricating method, the step of forming the driving device further includes the step of forming a hole exposing at least one of a substrate and the buffer film between the adjacent channels.

In the fabricating method, the heat conductive material is in contact with the buffer film through the hole, and in addition, is formed on the entire surface of the driving device.

In the fabricating method, the heat conductive material includes SiNx.

In the fabricating method, the heat conductive material has a heat conductivity of about 16 to 22 W/mK.

BRIEF DESCRIPTION OF THE DRAWINGS

These and other advantages of the present invention will be apparent from the following detailed description of the embodiments of the present invention with reference to the accompanying drawings, in which.

DETAILED DESCRIPTION OF THE EMBODIMENTS

Reference will now be made in detail to embodiments of the present invention, examples of which are illustrated in the accompanying drawings.

Hereinafter, the embodiments of the present invention will be described in detail with reference to FIGS. 8 to 16.

Figure 1:
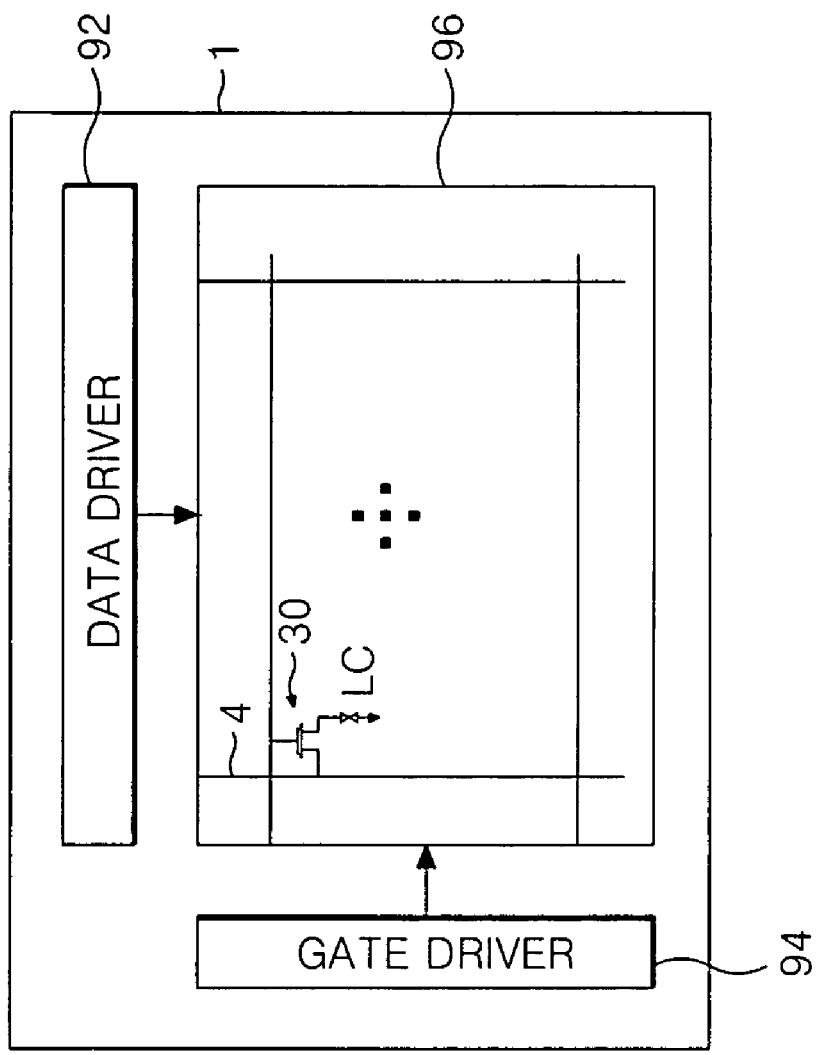
FIG. 1 is a plan view illustrating the composition of a liquid crystal display device of the related art in detail.
Figure 2:
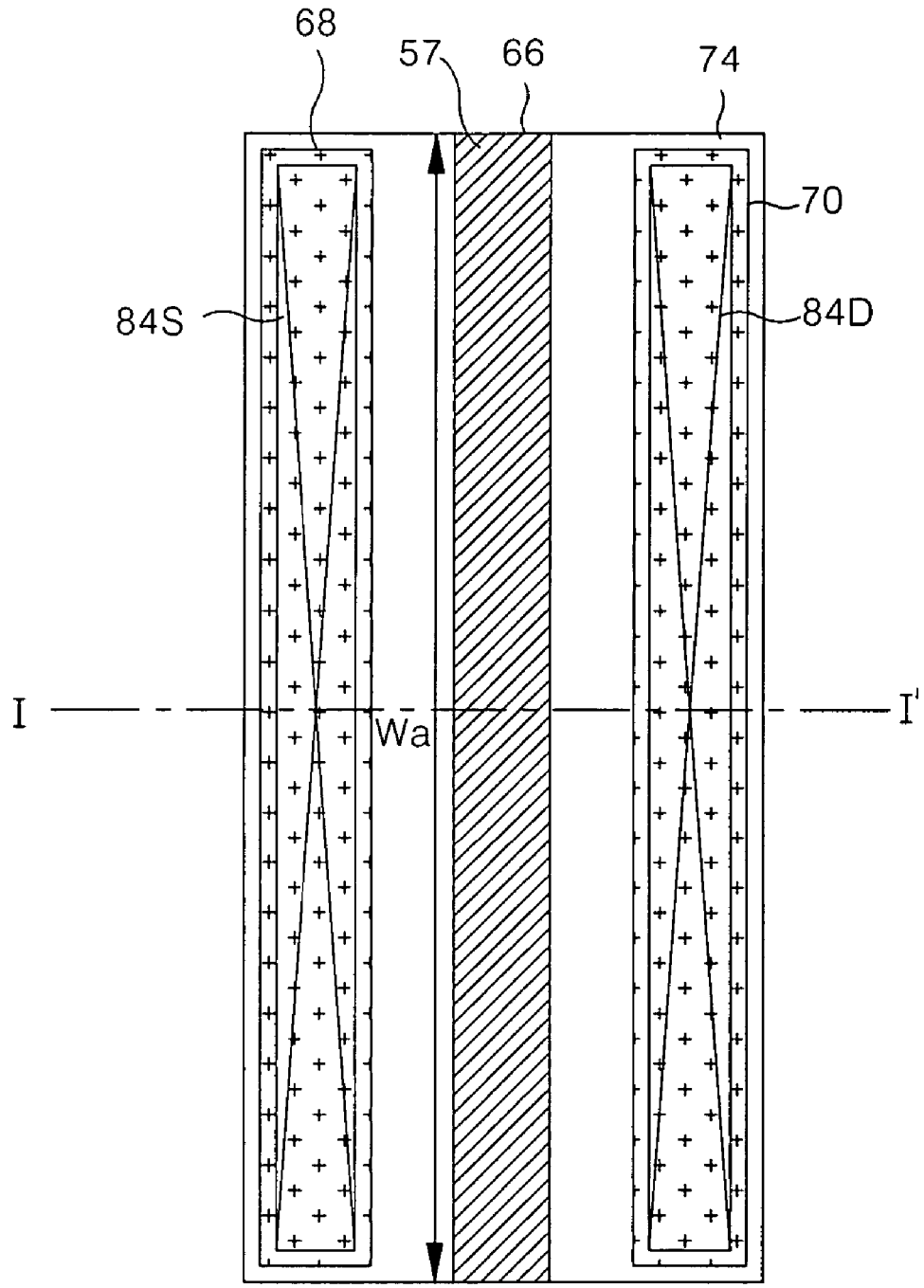
FIG. 2 is a plan view illustrating a switching device composed of one thin film transistor that is formed at a driving circuit of the liquid crystal display device of the related art.
Figure 3:
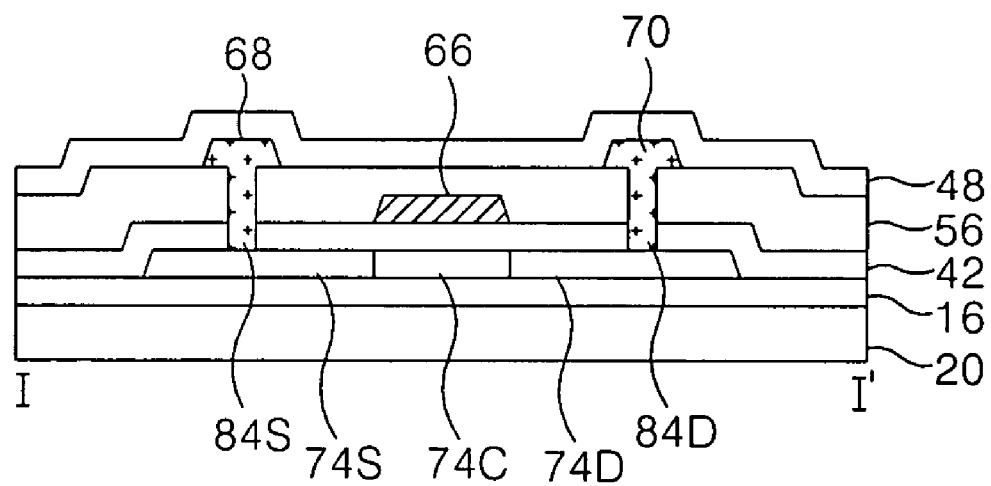
FIG. 3 is a sectional view illustrating the switching device, shown in FIG. 2, taken along the line "I-I'"
Figure 4:
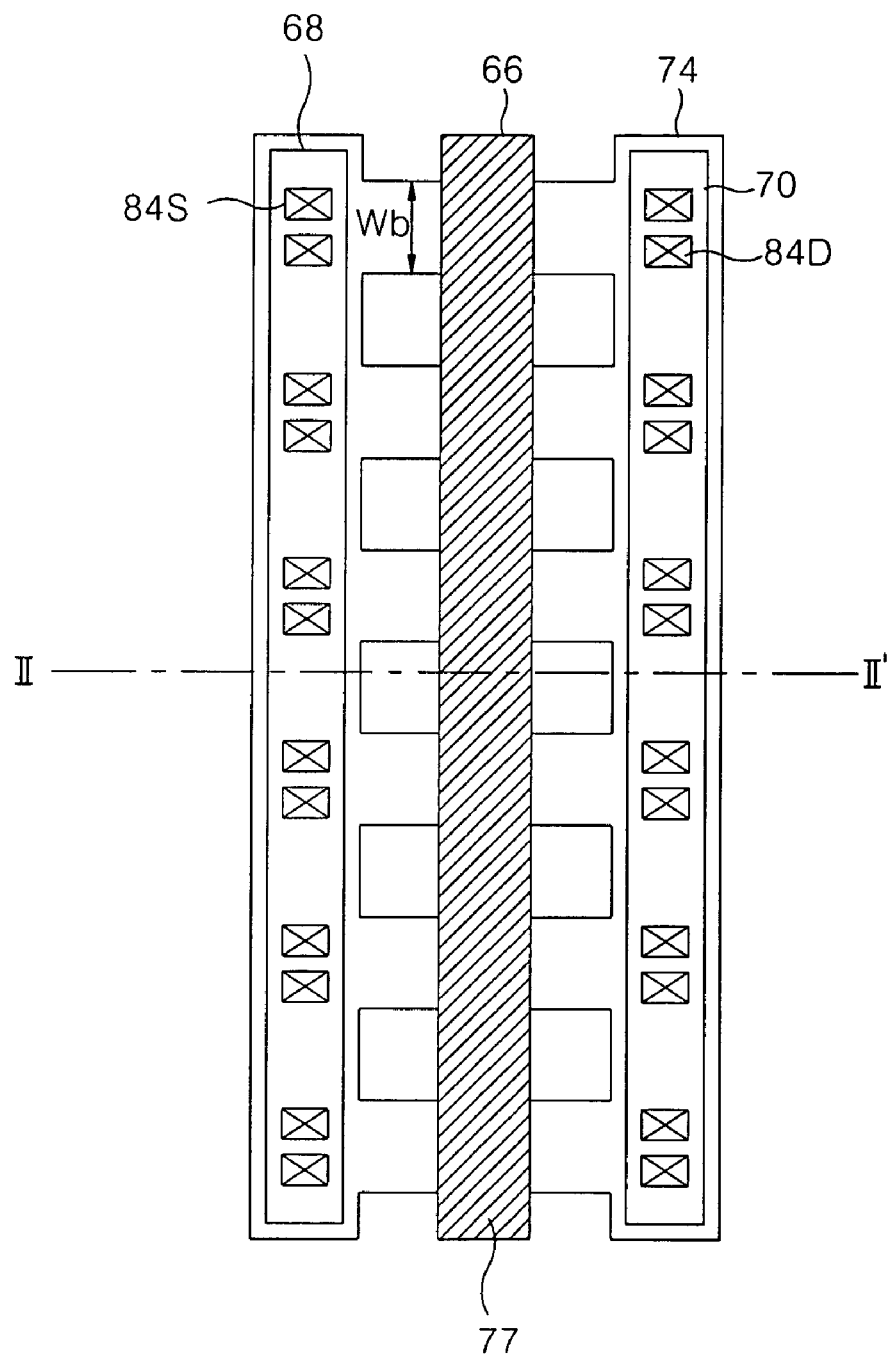
FIG. 4 is a plan view illustrating a driving device composed of a plurality of thin film transistors that are formed at d driving circuit of the liquid crystal display device of the related art.
Figure 5:
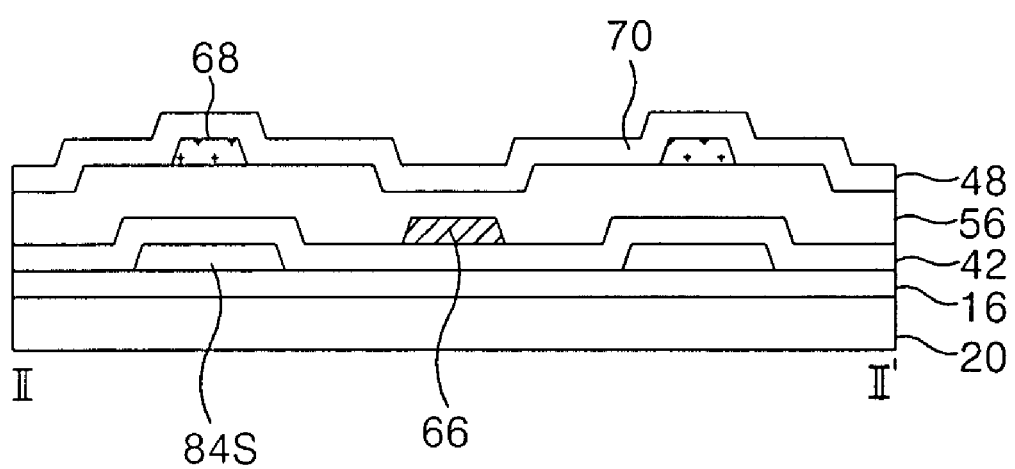
FIG. 5 is a sectional view illustrating the driving device, shown in FIG. 4, taken along the line "II-II'"
Figure 6:
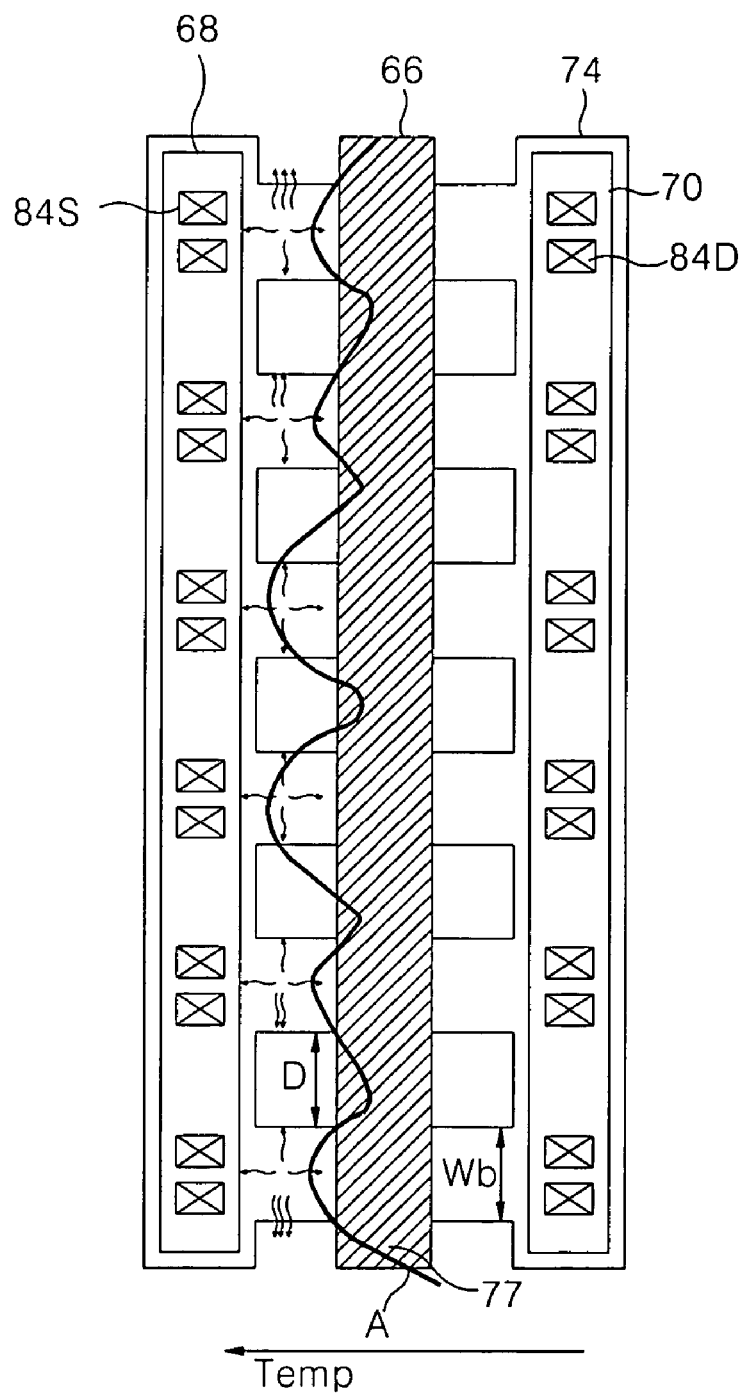
FIG. 6 is a plan view representing the temperature distribution of a channel area of a driving device of a driving circuit part shown in FIG. 4.
Figure 7:
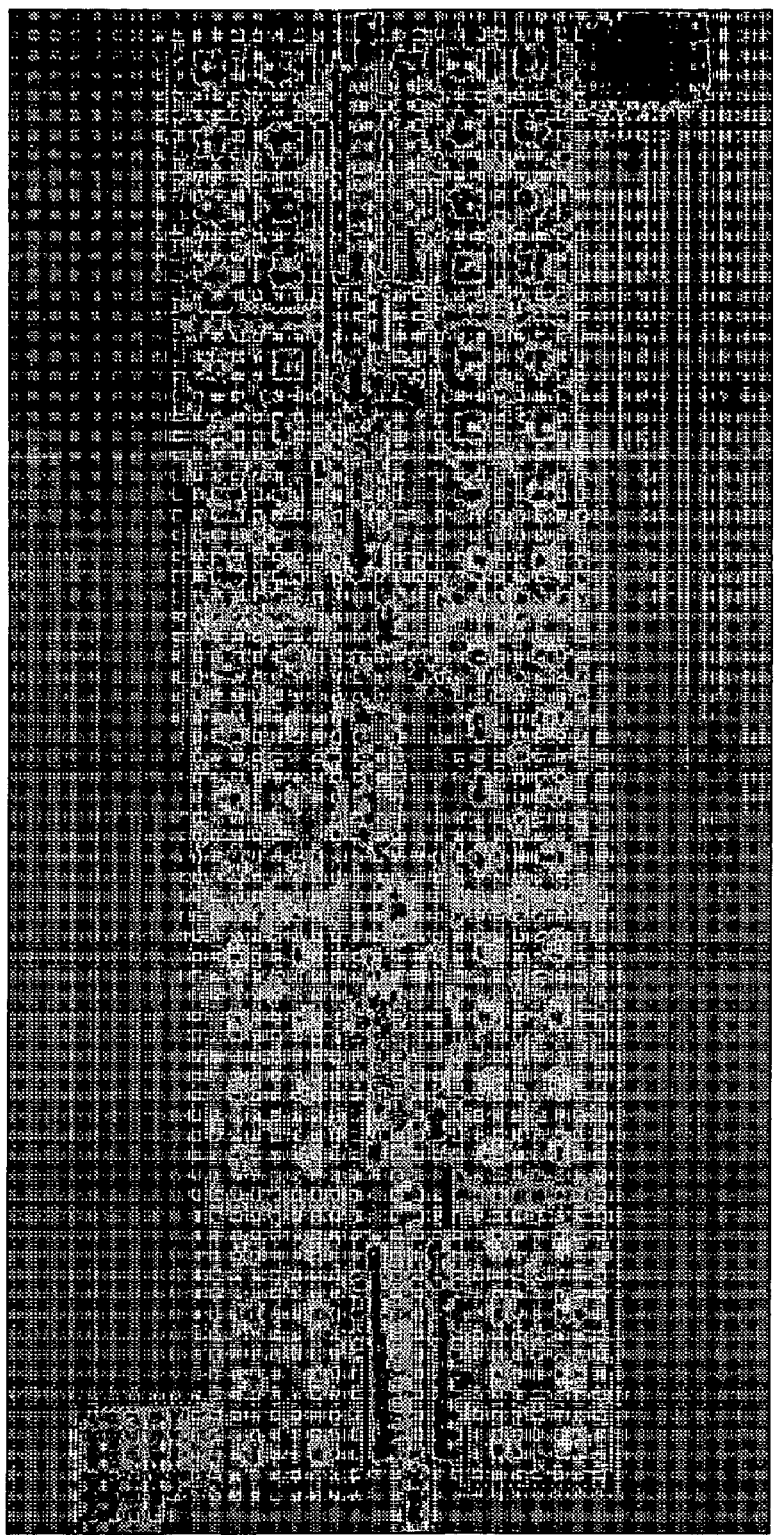
FIG. 7 is an experiment result representing that the channel area of the central part of the driving device is damaged in the driving circuit part of the related art.
Figure 8:
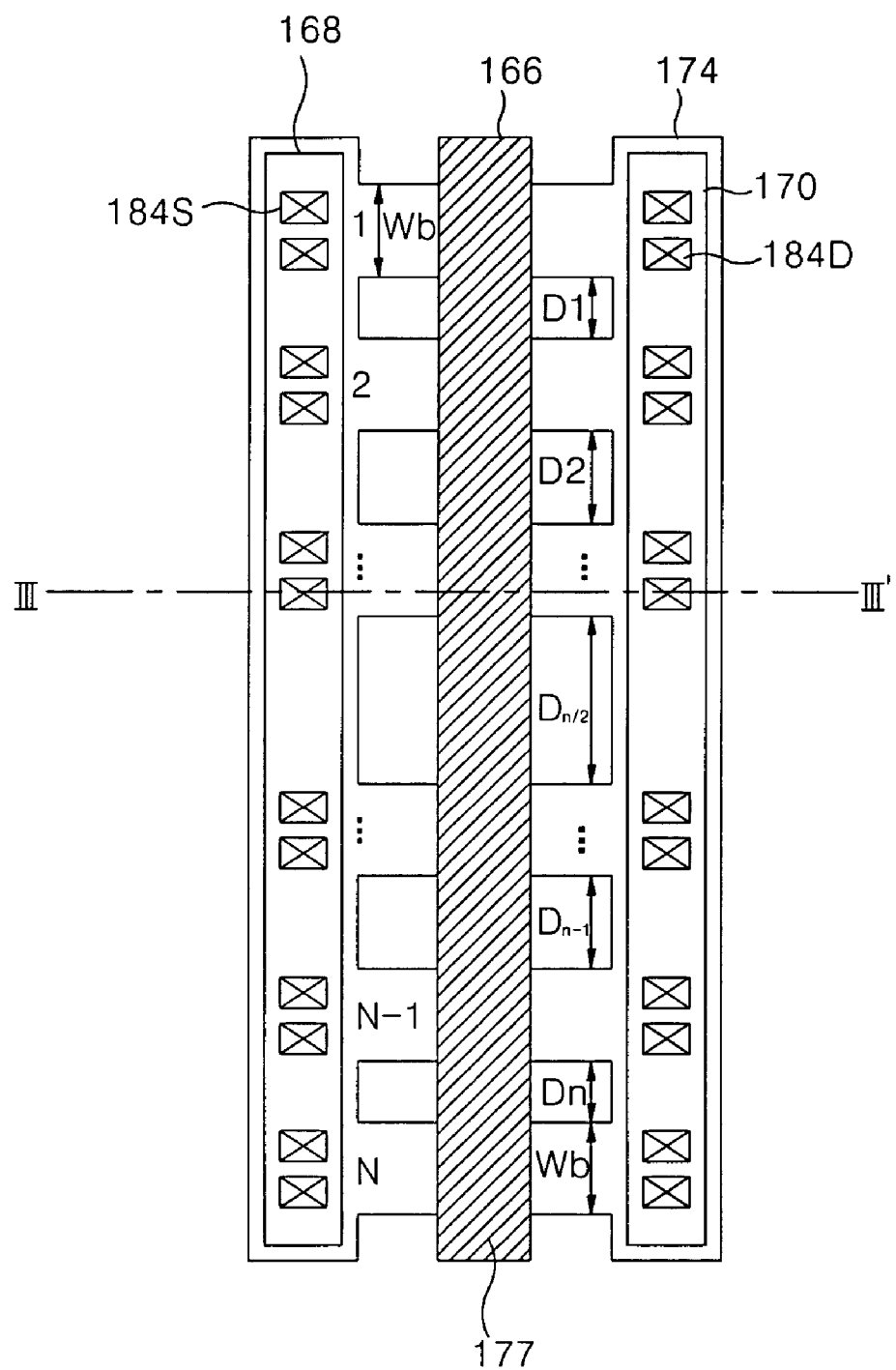
FIG. 8 is a plan view representing a driving device of a driving circuit of a liquid crystal display device according to a first embodiment of the present invention.
Figure 9:
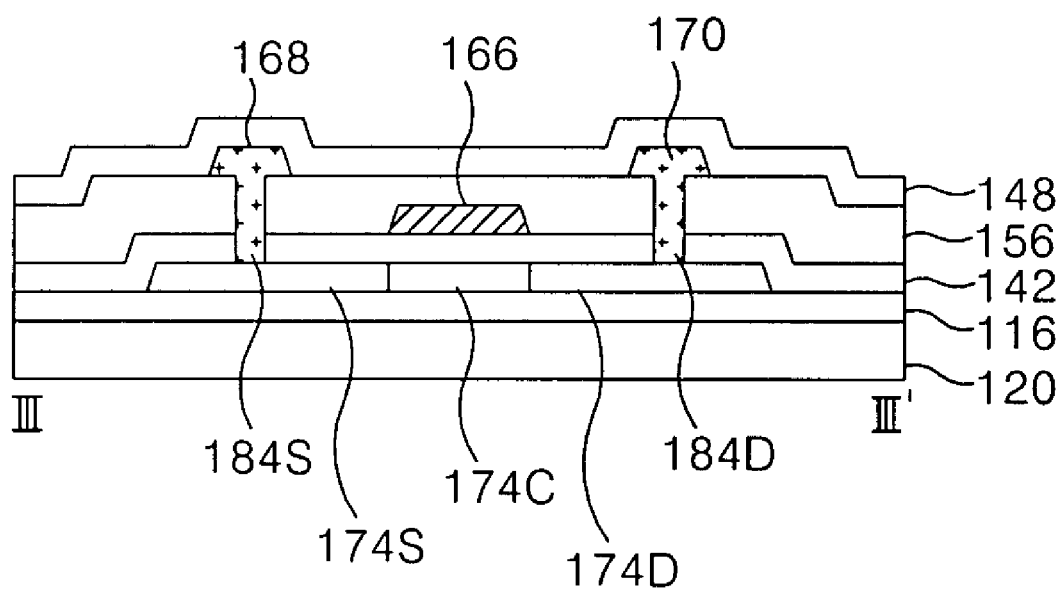
FIG. 9 is a sectional view illustrating the driving device of the driving circuit of the liquid crystal display device, shown in FIG. 8, taken along the line "III-III'"

FIG. 8 is a plan view illustrating in detail a driving device of a structure that a plurality of poly silicon type thin film transistors formed at a driving circuit of a liquid crystal display device according to the present invention are connected in parallel. FIG. 9 is a sectional view illustrating the driving device of the driving circuit, shown in FIG. 8, taken along the line "III-III'".

Referring to FIGS. 8 and 9, a driving device composed of a plurality of thin film transistors includes an active layer 174 having impurities injected therein, with a buffer film 116 therebetween on a lower substrate 120; a gate electrode 166 formed to overlap a channel area 174C of the active layer 174 with a gate insulating film 142 therebetween; source and drain electrodes 168 and 170, respectively, formed to be insulated with the gate electrode and a go-between insulating film 156 therebetween; and a protective film 148 formed on the source and drain electrodes 168 and 170 to protect the driving device.

The source/drain electrodes 168 and 170 is in contact with source/drain areas 174S 174D, respectively, of the active layer 174 into which designated impurities are injected through source/drain contact holes 184S 184D that penetrate the gate insulating film 142 and the go-between insulating film 156.

The active layer 174 includes a plurality of channels 177 having the same channel width Wb and distances D between the channels that have different widths in accordance with their locations, i.e., the distances (D1, D2, ..., Dn/2, ..., Dn−1, Dn) between the channels become narrower with each distance from the edge of the switching device to the center on the basis of the distance (Dn/2) between the channels that are located at the center of the switching device.

Herein, the distance D between the channels is defined by formula 1 and formula 2.

$$Dn/2 \times n = D1 + D2 + \ldots Dn/2 \ldots + Dn-1 + Dn \quad \text{[Formula 1]}$$

$$Dn/2 > \ldots > (D2 = Dn-1) > (D1 = Dn) \quad \text{[Formula 2]}$$

Figure 10:
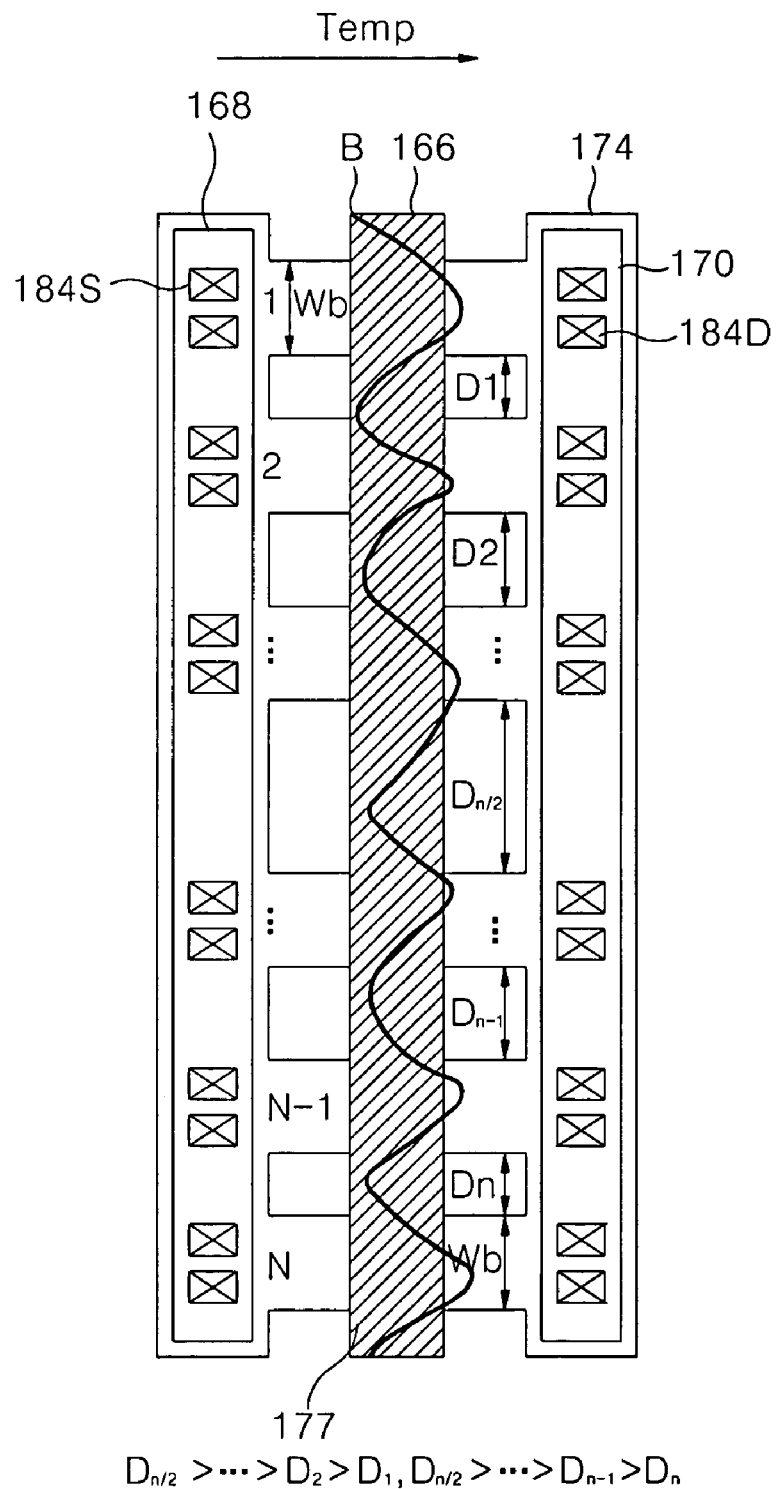
FIG. 10 is a plan view representing the temperature distribution of a channel area of the driving device of the driving circuit part shown in FIG. 8.

Accordingly, the heat generated at the channel 177 is equally transmitted and then radiated by the gate insulating film 142 and the intermediate insulating film 156 regardless of the location of the channel 177. Thus all the channels 177 of the driving device, as shown in FIG. 10, have uniform temperature distribution B.

More specifically, the driving device used in the driving circuit part has a structure where a plurality of thin film transistors with narrow channel widths Wb are connected in parallel so that a relatively large amount of electric current can flow for switching relatively high voltages. The driving circuit is driven to cause a lot of electric current to flow in the channel 177 of the driving device, thus the heat generated in the channel 177 is transmitted and radiated by the gate insulating film 142 and the intermediate insulating film 156 that are formed at the distance D between a plurality of channels with different widths corresponding to their location. In other words, the distance D between the channels adjacent to the channel 177 of the central part of the driving device wider than the distance D between the channels formed at areas other than the central part of the driving device. Accordingly, the distance D between the channels, which are adjacent to the channel 177 of the central part of the driving device of the driving circuit part, can have the gate insulating film 142 and the intermediate insulating film 156 formed, wherein the gate insulating film 142 and the intermediate insulating film 156 have a width wider than the related art. As a result, the heat generated at the central area of the driving device is transmitted and radiated by the gate insulating film 142 and the intermediate insulating film 156 that are located within the distance D between the channels, which are formed more broadly than in the related art, thereby being capable of preventing the defect of the driving device, e.g., the channel 177 of the central part of the driving device is not deteriorated.

FIGS. 11A to 11D are diagrams representing a fabricating method of a driving device located in the driving circuit part, shown in FIG. 8.

Figure 11A:
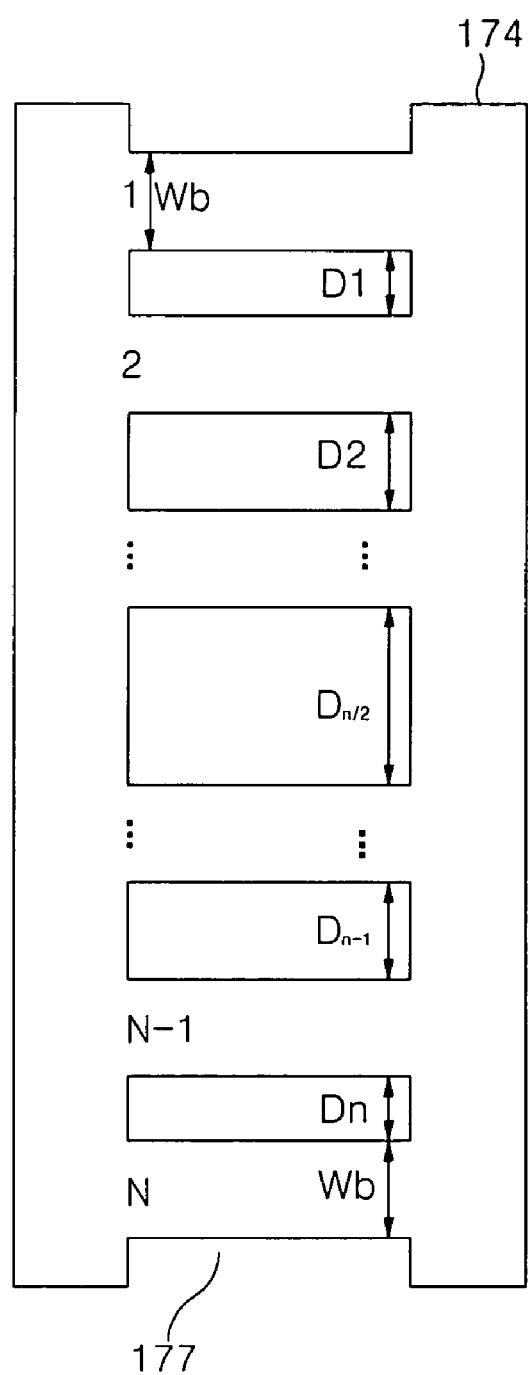
FIGS. 11A to 11D are plan views explaining a fabricating method of the driving device shown in FIG. 8.

Firstly, an insulating material, i.e., SiO2, is deposited over the entire surface of the lower substrate 120 and then it is patterned to form a buffer film 116. An amorphous silicon film is deposited on the lower substrate 120 where the buffer film has been formed, and then the amorphous silicon film is crystallized by a laser to become a poly silicon film, which is then patterned by a photolithography process using a mask and an etching process. Accordingly, the active layer 174, as shown in FIG. 11A, having the same channel width Wb and the distance D between the channels with different widths from one another in accordance with their location is formed. In other words, the active layer 174 includes the distances (D1, D2, . . . , Dn/2, . . . , Dn−1, Dn) between the channels whose widths become narrower based on their position from the edge of the driving device to the center on the basis of the distance (Dn/2) between the channels that are located at the center of the driving device. Each of the distances D between the channels is formed as defined in formula 1 and formula 2.

$$Dn/2 \times n = D1 + D2 + \ldots Dn/2 \ldots + Dn-1 + Dn \quad \text{[Formula 1]}$$

$$Dn/2 > \ldots > (D2 = Dn-1) > (D1 = Dn) \quad \text{[Formula 2]}$$

Figure 11B:
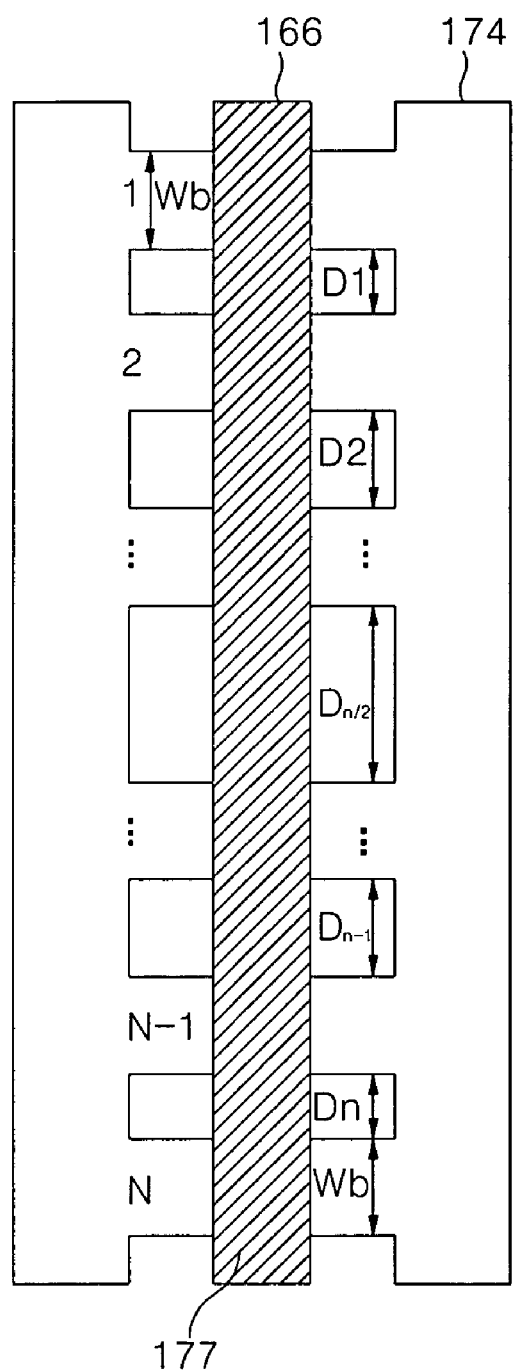

An insulating material such as SiO2 is deposited over the entire surface of the lower substrate 120, where the active layer 174 has been formed to form a gate insulating film 142. After a gate metal layer is deposited over the entire surface of the lower substrate 120 where the gate insulating film 142 has been formed, the gate metal layer is patterned by photolithography using a mask and etching process thereby forming a gate electrode 166 as shown in FIG. 11B. Herein, the gate metal layer may be aluminum group metal such as aluminum Al or aluminum/neodymium Al/Nd. n− ions are injected into the active layer 174 using the gate electrode 166 as a mask. Thus the active layer 174 that overlaps the gate electrode 166 becomes a channel area 174C, and the active layer 174 that does not overlap the gate electrode 166 becomes an LDD area 174L.

After a photo-resist is deposited over the entire surface of the lower substrate 120, the photo-resist is patterned by photolithography using a mask to form a photo-resist pattern. The photo-resist pattern is formed to expose the LDD area of the active layer 174. n+ ions or p+ ions are injected into the active layer 174 using the photo-resist pattern as a mask to form a source area 174S and a drain area 174D of the active layer 174.

Figure 11C:
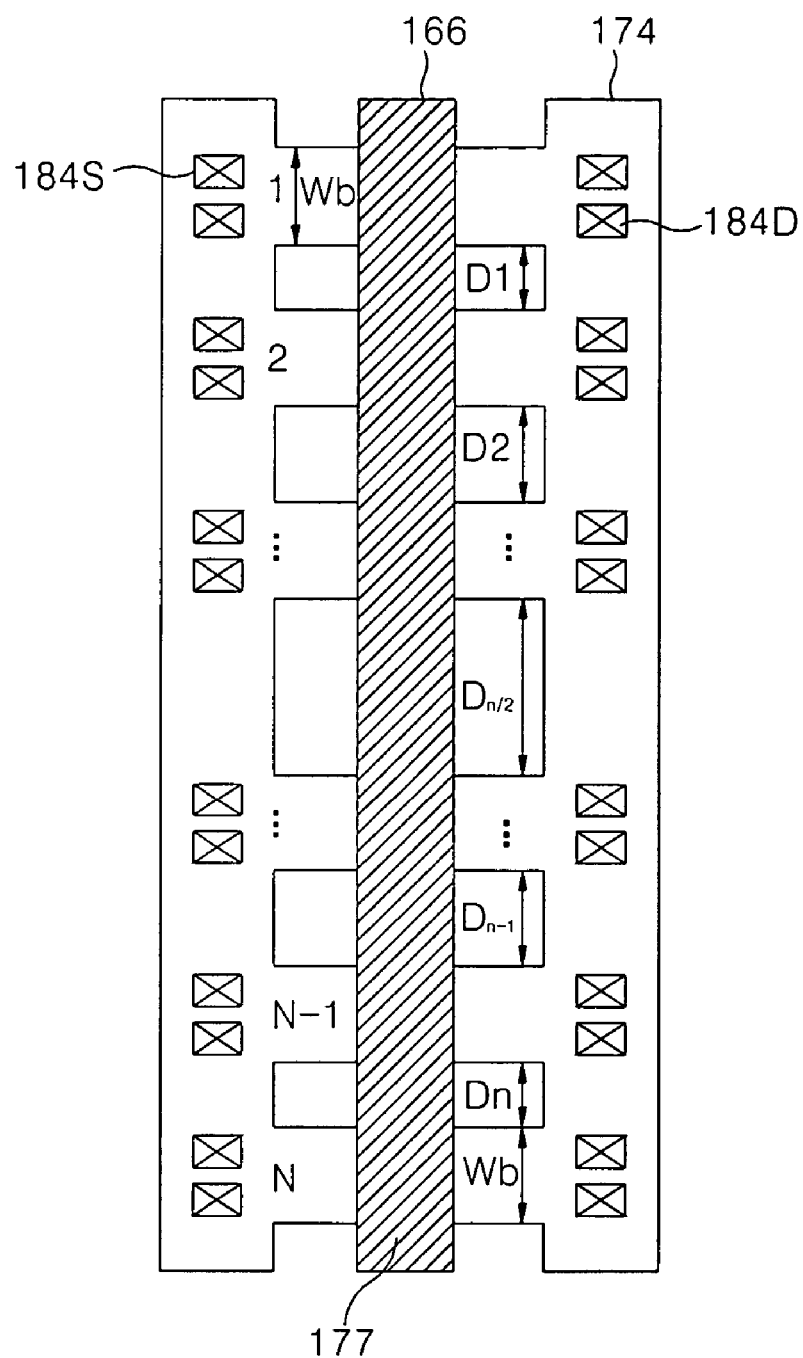

The insulating material such as SiO2 is deposited over the entire surface of the lower substrate 102 where the active layer 174 with n+ ion or p+ ion injected thereinto has been formed, thus an intermediate insulating film 156 is formed. After then, the intermediate film 156 and the gate insulating film 142 are patterned by the photolithography process using the mask and the etching process. Accordingly, as shown in FIG. 11C, a source contact hole 184S and a drain contact hole 184D, are found which expose the source area 174S and the drain area 174D, respectfully.

Figure 11D:
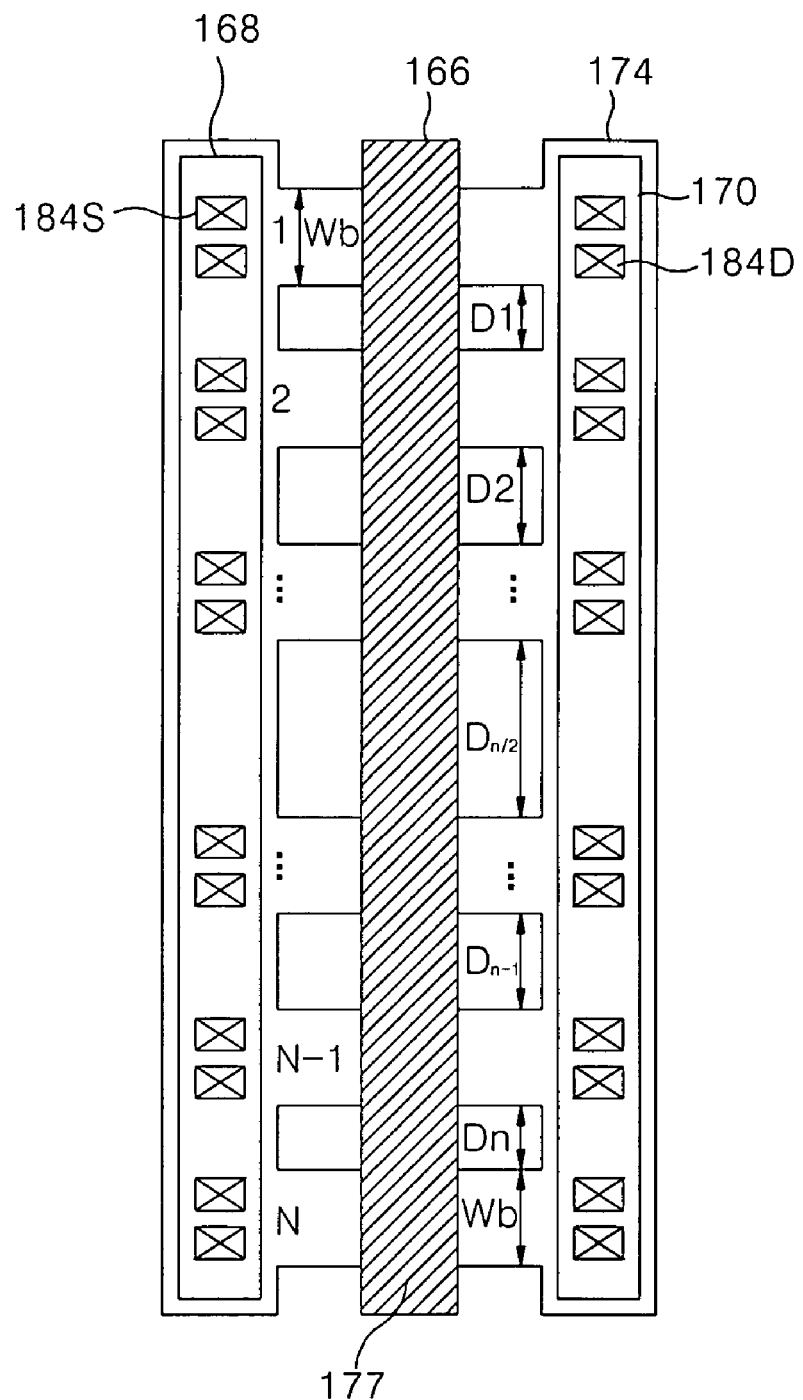

After a data metal layer is deposited over the entire surface of the lower substrate 120 where the source contact hole 184S and the drain contact hole 184D are found to be formed, the data metal layer is patterned by the photolithography process using the mask and the etching process. Accordingly, as shown in FIG. 11D, the source and the drain electrodes 168, 170 are formed. The source and drain electrodes 168, 170 are in contact with the source area 174S and the drain area 174D of the active layer 174 through the source contact hole 184S and the drain contact hole 184D.

An insulating material such as SiNx is deposited over the entire surface of the lower substrate 120 where the source and drain electrodes 168, 170, respectively, have been formed to form a protective film 148.

The liquid crystal display device and the fabricating method thereof according to the first embodiment of the present invention has the plurality of the channels 177 at the driving device of the driving circuit part, wherein the channels have the same channel width Wb but the distances (D1, D2, . . . , Dn/2, . . . , Dn−1, Dn) between the channels have progressively narrower widths as from the center to the edge of the driving device on the basis of the distance (Dn/2) between the channels that are located at the center of the driving device. Accordingly, the heat generated at the central area of the driving device is transmitted and radiated by the gate insulating film 142 and the intermediate insulating film 156 that are located within the distance D between the channels which are formed more broadly than in the prior art, thereby preventing the defect of the driving device, i.e., the channel 177 of the central part of the driving device is prevented from deteriorating.

Figure 12:
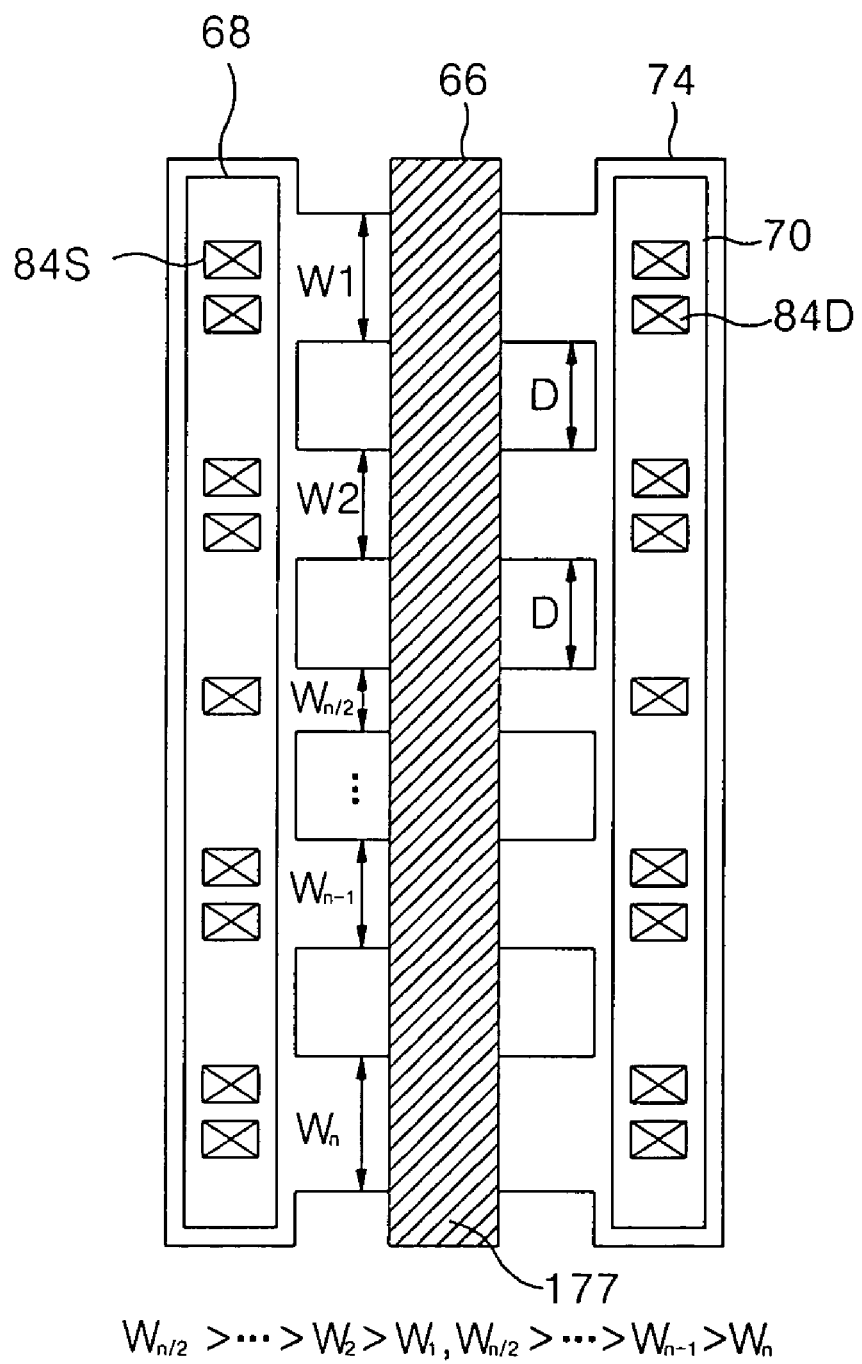
FIG. 12 is a plan view representing a driving device of a driving circuit of a liquid crystal display device according to a second embodiment of the present invention.

FIG. 12 is a plan view illustrating a driving device of a driving circuit part of a liquid crystal display device according to a second embodiment of the present invention.

The driving device of the driving circuit part shown in FIG. 11, when compared with the driving device shown in FIGS. 8 and 9, has the same components except that the channel 177 is formed to have different widths in accordance with its location and the distance D between the channels is the same regardless of the location, thus the same reference numeral is given to the same component as FIGS. 8 and 9 and further description will be omitted.

The driving device includes the same distance D between the channels regardless of their locations, but the channels (W1, W2, . . . , Wn/2, . . . , Wn−1, Wn) become wider at the edge of the driving device relative to the channel (Wn/2) located at the center of the driving device.

Each of the channels W is defined by the following formula 3 and formula 4.

$$Wn/2 \times n = W1 + W2 + \ldots Wn/2 \ldots + Wn-1 + Wn \quad \text{[Formula 3]}$$

$$Wn/2 > \ldots > (W2 = Wn-1) > (W1 = Wn) \quad \text{[Formula 4]}$$

Accordingly, a smaller amount of electric current flows in the channel 177 of the central part of the driving device than in the channel 177 of the edge of the driving device. As a result, a smaller amount of heat is generated at the central part of the driving device, which has relatively low heat resistance capability, and more heat is generated in the edge area of the driving device, which has relatively high heat resistance capability. Therefore, all the channels 177 of the driving device have a substantially fixed temperature distribution.

The fabricating method of the driving device located at the driving circuit part of the liquid crystal display device according to the second embodiment of the present invention includes the same distance D between the channels regardless of their locations, but the channels (W1, W2, . . . , Wn/2, . . . , Wn−1, Wn) have increasingly wider widths the closer they are to the edge of the driving device. The widths are based on the width of the channel (Wn/2) located at the center of the driving device, on the substrate where the buffer film 116 is formed. An active layer defined as the following formula 3 and formula 4 is formed in each of the channels W.

$$Wn/2 \times n = W1 + W2 + \ldots Wn/2 \ldots + Wn-1 + Wn \quad \text{[Formula 3]}$$

$$Wn/2 > \ldots > (W2=Wn-1) > (W1=Wn) \quad \text{[Formula 4]}$$

The fabricating method of the driving device of the driving circuit part according to the second embodiment of the present invention is the same as the fabricating method of the driving device of the driving circuit part of the liquid crystal display device according to the first embodiment of the present invention, illustrated in FIGS. 11A and 11D.

In this way, the liquid crystal display device and the fabricating method thereof according to the second embodiment of the present invention has the same distance D between the channels regardless of their locations and channels (W1, W2, ..., Wn/2, ..., Wn−1, Wn) formed to have their width get wider as it goes to the edge of the driving device on the basis of the channel (Wn/2) located at the center of the driving device. Accordingly, a relatively smaller amount of electric current flows in the channel of the central part of the driving device than in that of the related art, and a relatively larger amount of electric current flows in the channel 177 of the edge of the driving device than in the related art. As a result, the overall amount of driving current is sustained and the amount of generated heat is small in the channel 177 of the central part of the driving device as due to its relatively narrow channel width, thereby not generating a problem in which the central part of the driving device deteriorates. The prevention of a defect of the driving device allows the driving device to operate in a normal way.

Hereinafter, a third embodiment of the present invention will be described in detail in reference with FIGS. 13 to 16E.

Figure 13:
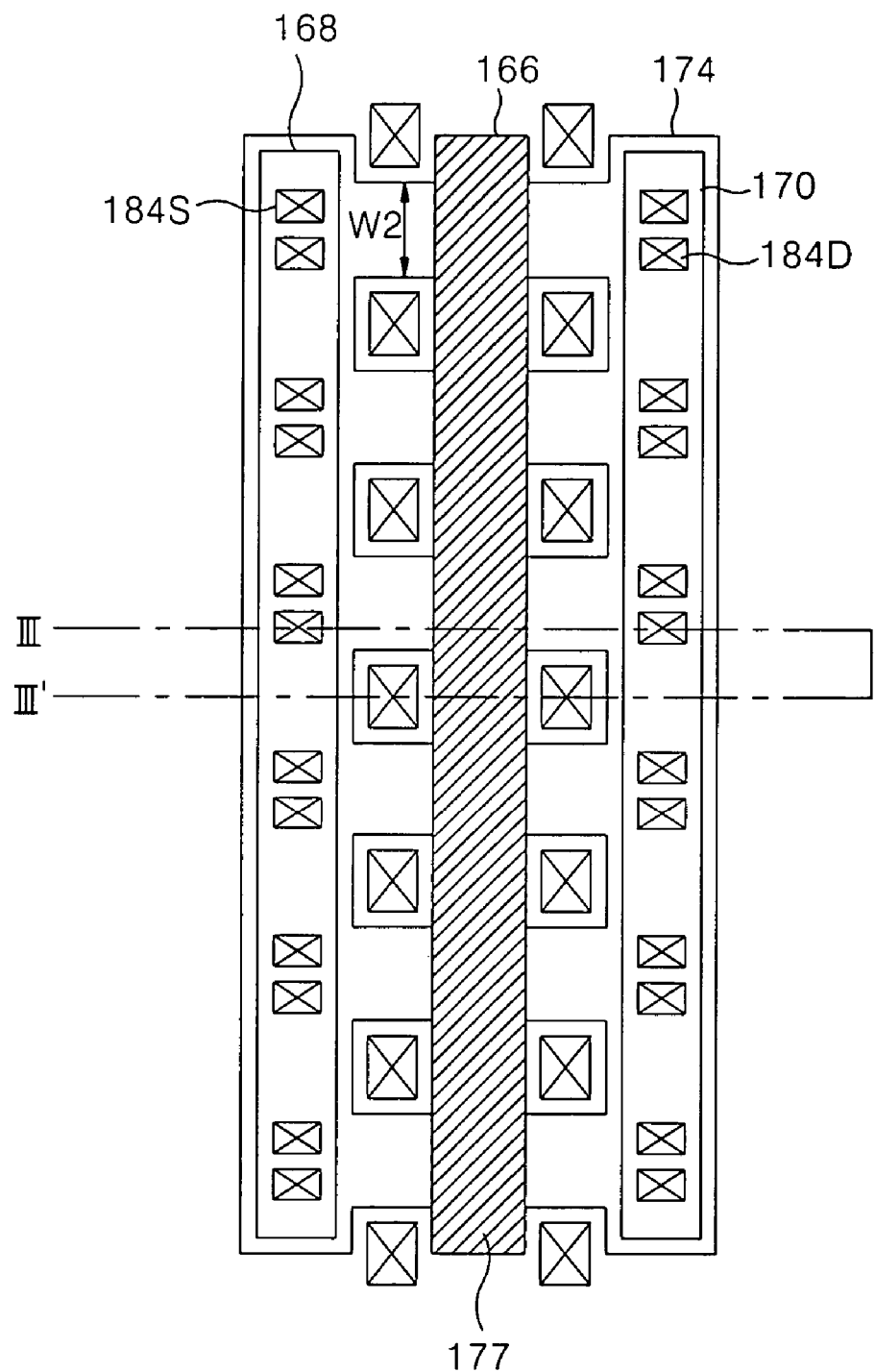
FIG. 13 is a plan view illustrating a driving device of the structure that a plurality of thin film transistors are connected in parallel to a driving circuit of a liquid crystal display device according to an embodiment of the present invention.
Figure 14:
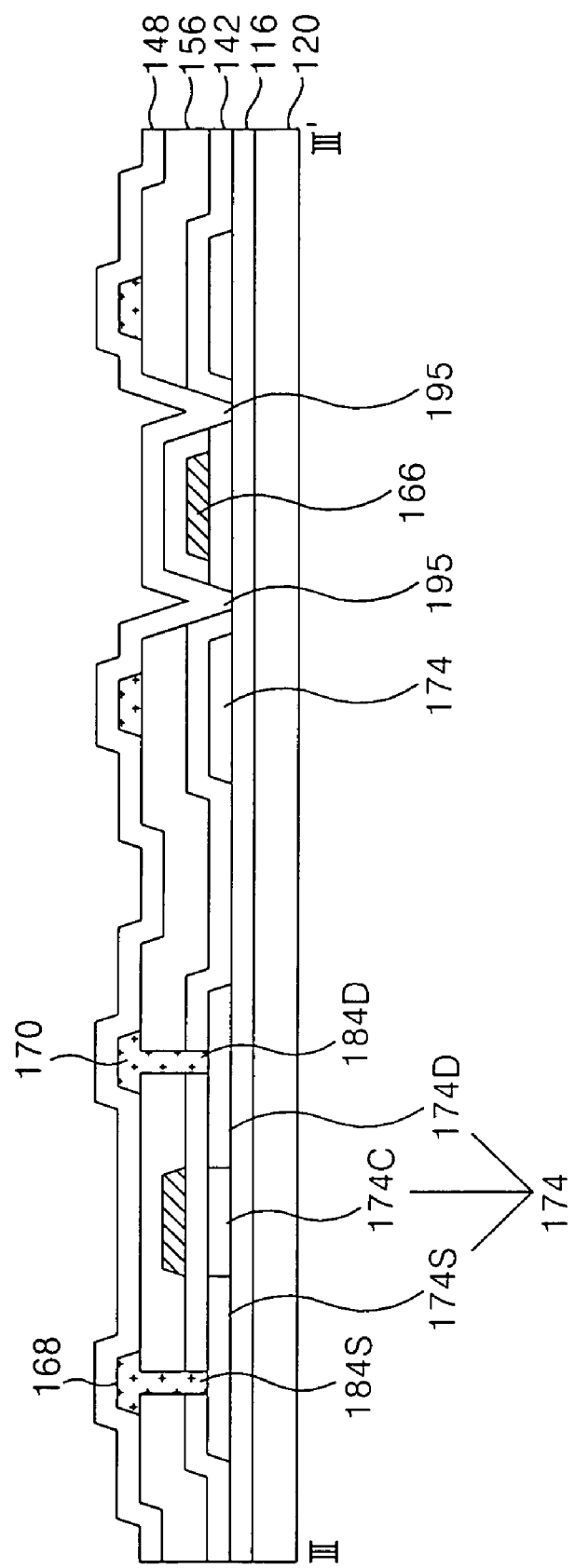
FIG. 14 is a sectional view illustrating the driving device of the driving circuit part of the liquid crystal display device, shown in FIG. 13, taken along the line "III-III'"

FIG. 13 is a plan view illustrating in detail an embodiment of a driving device having a structure in which structure a plurality of thin film transistors are connected in parallel to a driving circuit of a liquid crystal display device. FIG. 14 is a sectional view illustrating the driving device of the driving circuit part of the liquid crystal display device, shown in FIG. 13, taken along the line "III-III".

Referring to FIGS. 13 and 14, the driving device of the driving circuit part composed of a plurality of thin film transistors includes an active layer 174, into which impurities such as n+ ions or p+ ions are injected, formed on the lower substrate 120 with the buffer film 116 therebetween; a gate electrode 166 formed to overlap the channel area 174C of the active layer 174 with the gate insulating film 142 therebetween; source/drain electrodes 168, 170 formed to be insulated with the gate electrode 166 and the go-between insulating film 156 therebetween; and a protective film 148 formed on the source/drain electrodes 168, 170 to protect the driving device.

The source/drain electrodes 168, 170 are in contact with the source/drain areas 174S and 174D of the active layer 174, into which a designated amount of impurities is injected, through source/drain contact holes 184S and 184D, respectively that penetrate the gate insulating film 142 and the go-between insulating film 156.

The protective film 148 is formed on the entire surface of the lower substrate 120 where the source/drain electrodes 168 and 170 have been formed, and in addition, it is formed to be in contact with the buffer film 116 through a penetrating hole 195 that goes through the gate insulating film 142 and the intermediate insulating film 156 between the channels 177.

Further, the penetrating hole 195 penetrates even the buffer film 116, so the protective film 148 can be in contact with the lower substrate 120.

Accordingly, the heat generated at the channel 177 is absorbed into the protective film 148 and is radiated to the outside of the driving device, thereby preventing damage to the driving device of the driving circuit part, such as the deterioration of the channel 177, for example.

More specifically, the driving device of the driving circuit part is composed of a plurality of thin film transistors having narrow channel widths W2 such a relatively large amount of electric current can flow for switching a relatively high voltage. If the driving circuit is driven in such a way as to make a lot of current flow in the channel 177 of the driving device, excessive heat is generated at the channel 177. The protective film 148 is of an insulating material such as SiNx that has a high heat conductivity of approximately 16 to 22 W/mK is formed, so the heat generated at the channel 177 is transmitted to the protective film 148 and then radiated to the outside of the driving device. In this way, the heat generated at the channel 177 is radiated through the protective film 148, thereby preventing the defect of the driving device. The driving circuit part has a current flow that is smooth and has the characteristic of the driving device sustained.

FIGS. 15A to 16E are plan views and sectional views representing the fabricating method of the driving device of the driving circuit part shown in FIGS. 13 and 14.

Figure 15A:
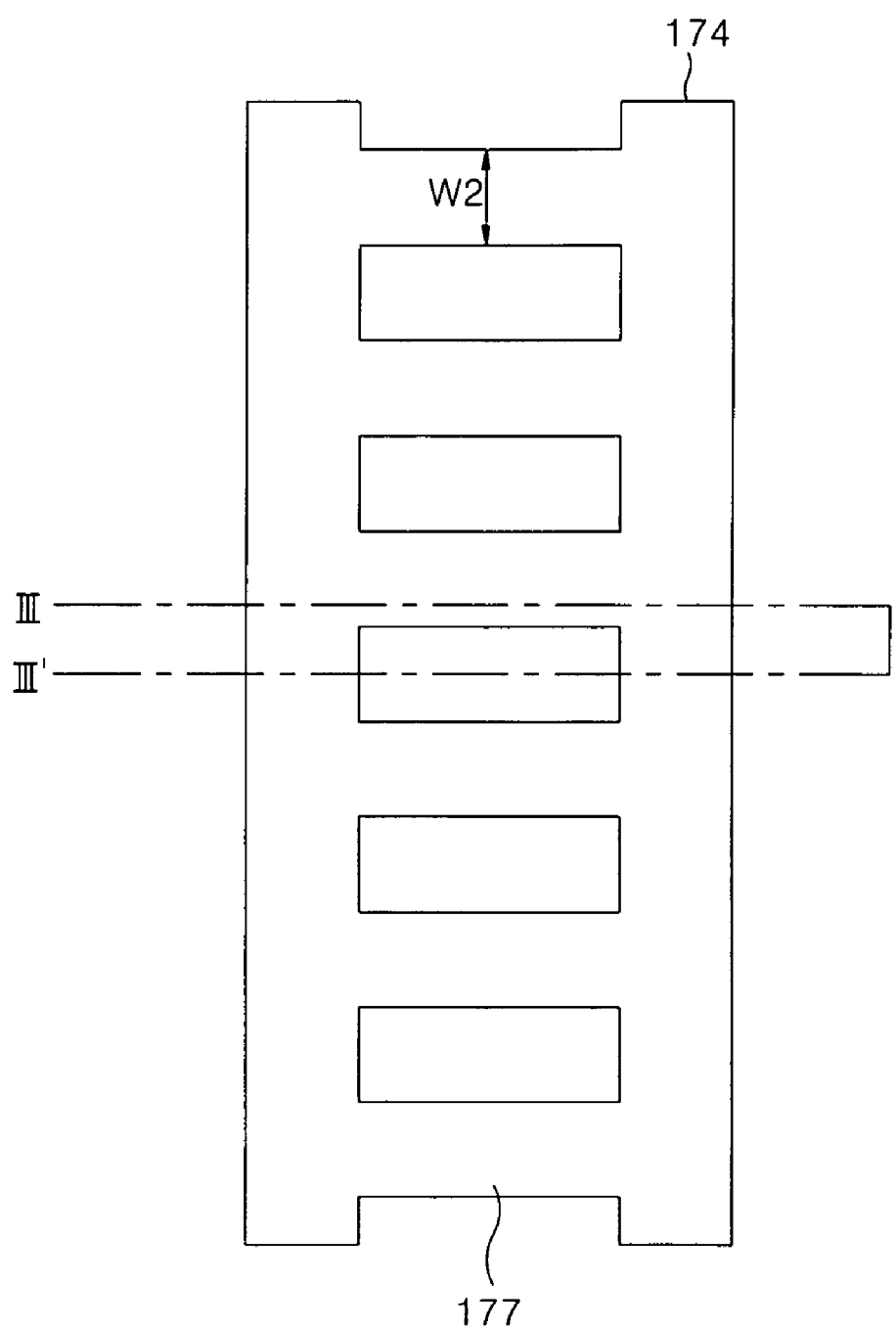
FIGS. 15A to 16E are plan views and sectional views explaining a fabricating method of the driving device of the driving circuit part shown in FIG. 13.

Firstly, an insulating material such as SiO2 is deposited over the entire surface of the lower substrate 120 and then is patterned to form the buffer film 116. After an amorphous silicon film is deposited on the lower substrate 120 where the buffer film 116 has been formed, the amorphous silicon film is crystallized by a laser to become a poly-silicon film. The poly-silicon film is patterned by a photolithography process using a mask and an etching process. Accordingly, as shown in FIGS. 15A and 16A, the active layer 174 having a plurality of channels is formed.

An insulating material of SiO2 is deposited over the entire surface of the lower substrate 120 where the active layer 174 has been formed, to form the gate insulating film 142. After a gate metal layer is deposited over the entire surface of the lower substrate 120 where the gate insulating film 142 has been formed, the gate metal layer is patterned by the photolithography process using the mask and the etching process, thereby forming a gate electrode 166. Herein, the gate metal layer is an aluminum group metal including aluminum Al, aluminum/neodymium Al/Nd and so on. n− ions are injected into the active layer 174 using the gate electrode 166 as a mask to turn the active layer 174 which overlaps the gate electrode 166 into the channel area 174C and the active layer 174 which does not overlap the gate electrode 166 into the LDD area 174L.

Figure 15B:
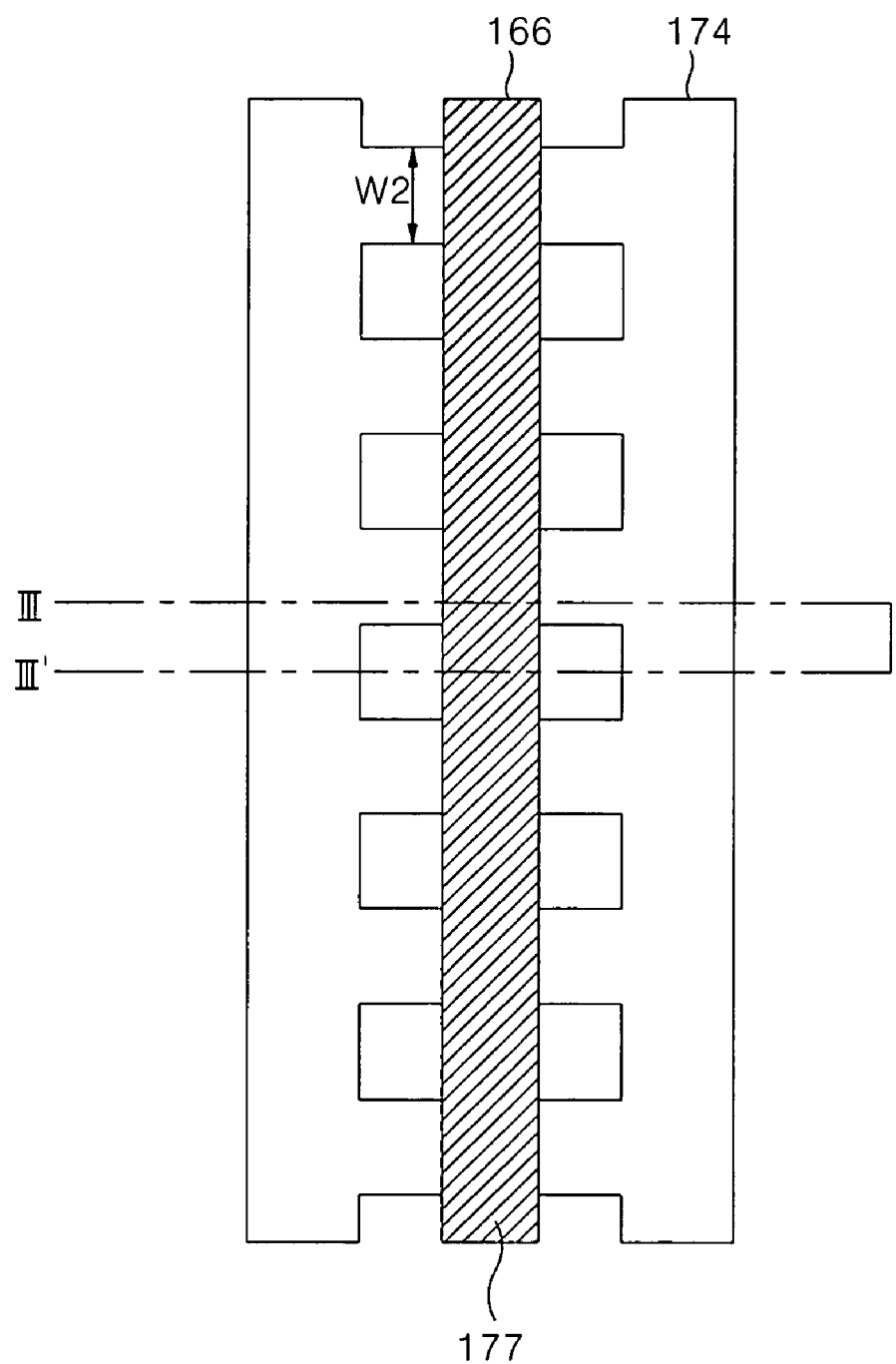
Figure 16B:
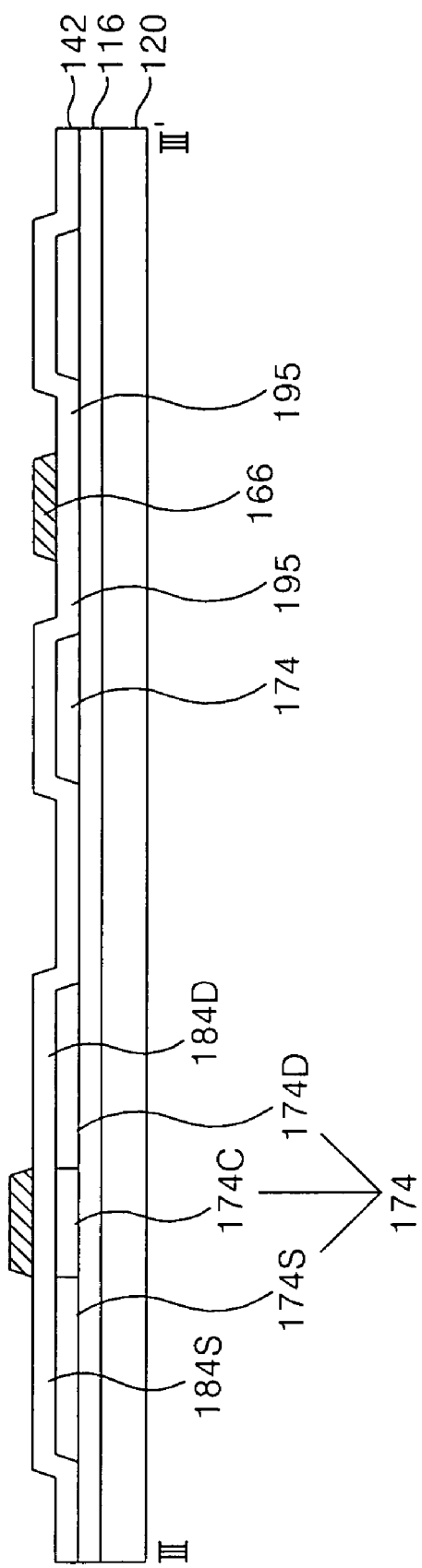

After a photo-resist is deposited over the entire surface of the lower substrate 120, the photo-resist is patterned by the photolithography process using the mask to form a photo-resist pattern. The photo-resist pattern is formed to expose the LDD area of the active layer 174. n+ ions or p+ ions are injected into the active layer 174 using the photo-resist pattern as a mask, as shown in FIGS. 15B and 16B, to form the source area 174S and the drain area 174D of the active layer 174.

Figure 15C:
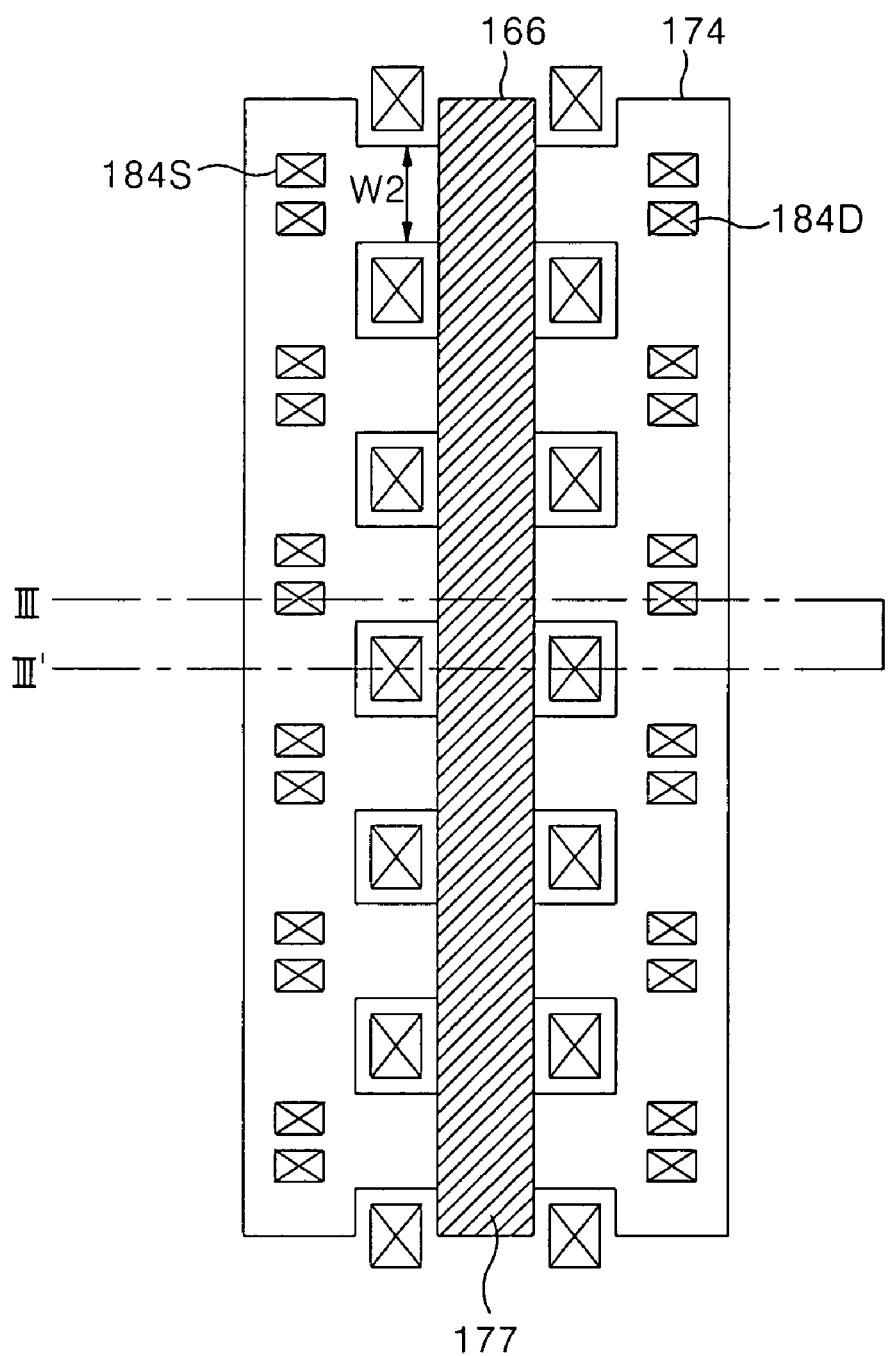
Figure 16C:
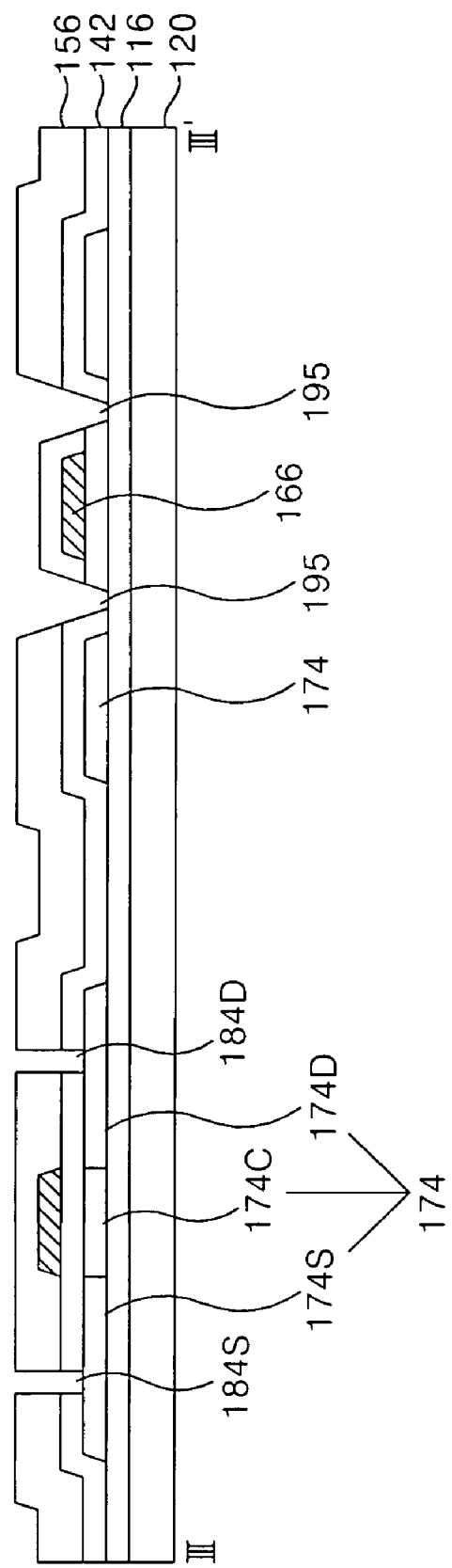

The insulating material of SiO2 is deposited over the entire surface of the lower substrate 120 where the active layer 174 with n+ ions or p+ ions injected therein has been formed, to form the intermediate insulating film 156. And then, the intermediate insulating film 156 and the gate insulating film 142 are patterned by the photolithography process using a mask and the etching process. Accordingly, as shown in FIGS. 15C and 16C, the source contact hole 184S and the drain contract hole 184D that expose the source area 174S and the drain area 174D, respectively, are formed, and the penetrating holes 195 that penetrate the gate insulating film 142 and the intermediate film 156 to expose the buffer film 116 are formed between the channels 177.

Figure 15D:
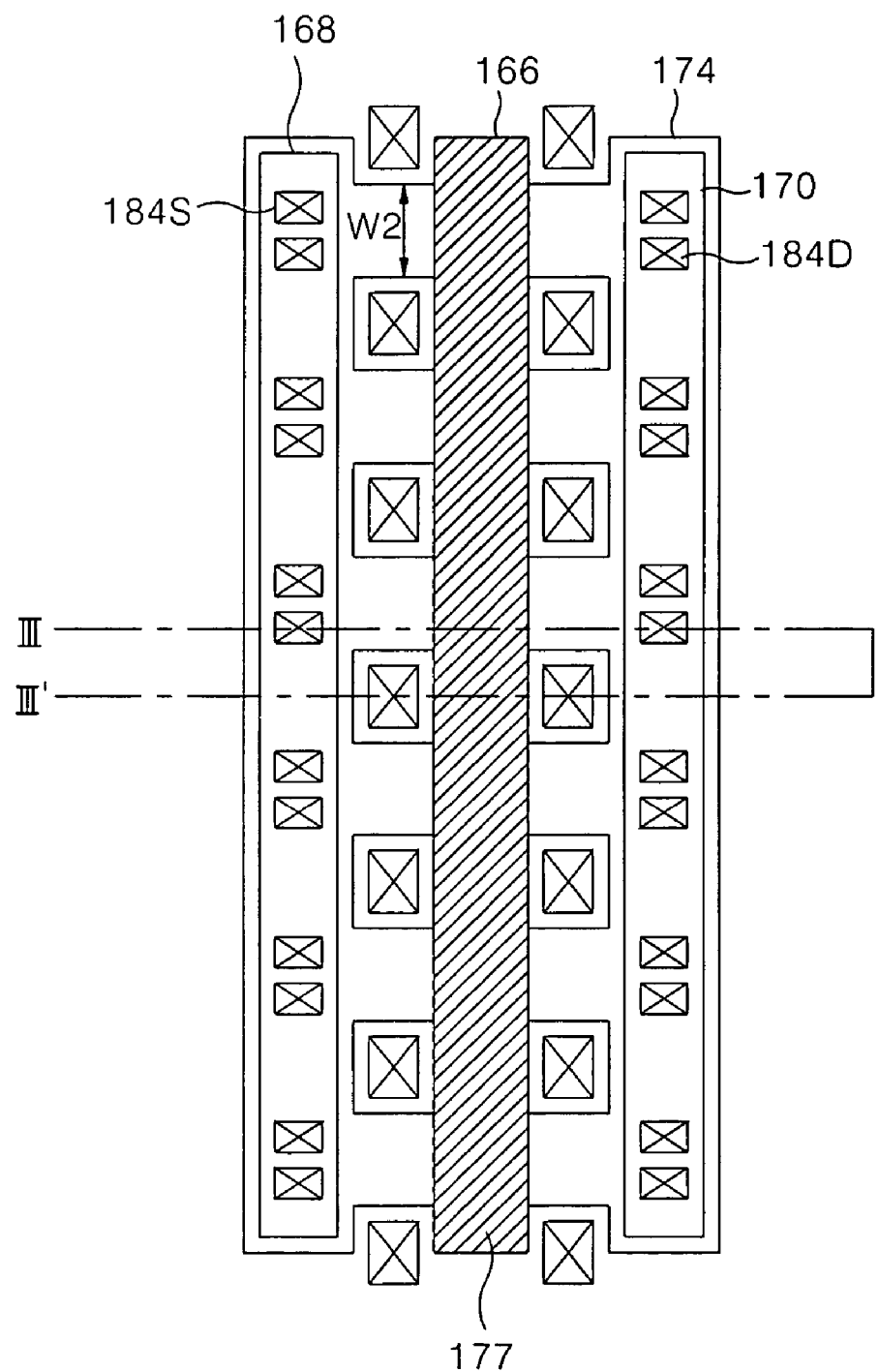
Figure 16D:
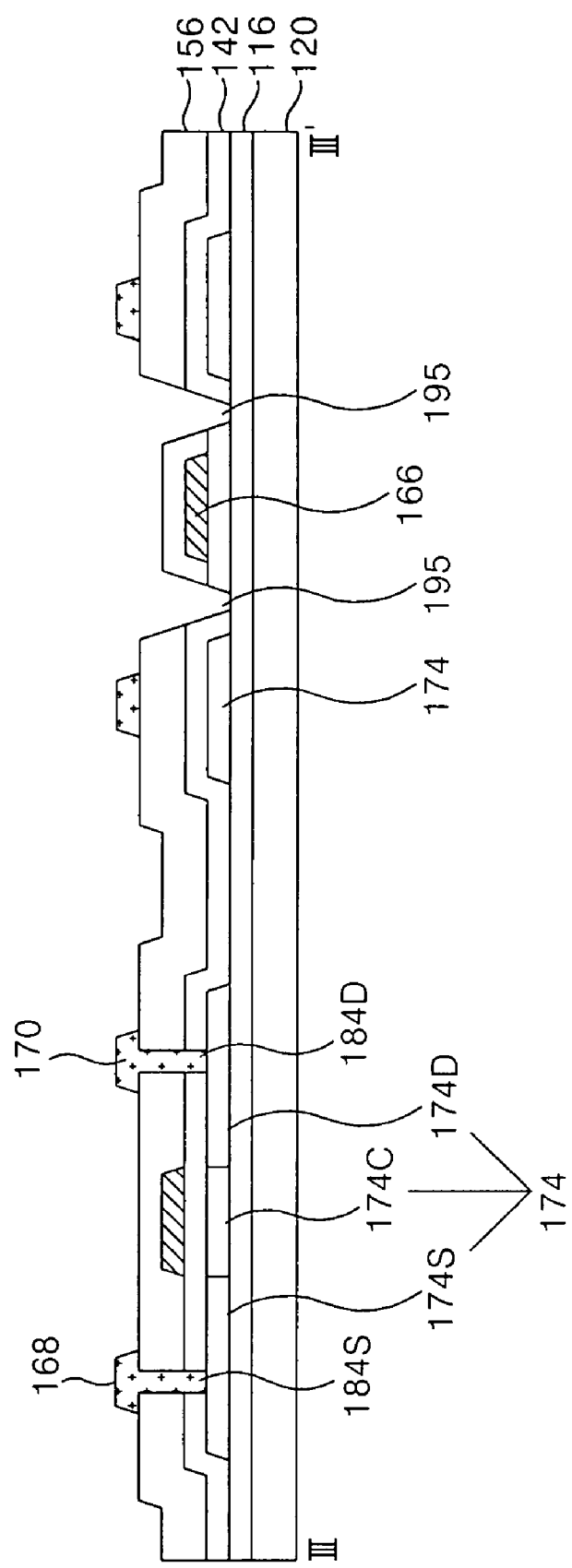

The data metal layer is deposited over the entire surface of the lower substrate 120 where the source contact hole 184S, the drain contact hole 184D and the penetrating hole 195 have been formed, and then the data metal layer is patterned by the photolithography process using the mask and the etching process. Accordingly, as shown in FIGS. 15D and 16D, the source and drain electrodes 168 and 170 are formed, respectively. The source and drain electrodes 168 and 170, respectively, are in contact with the source area 174S and the drain area 174D of the active layer 174 through the source contact hole 184S and the drain contact hole 184D.

Figure 16E:
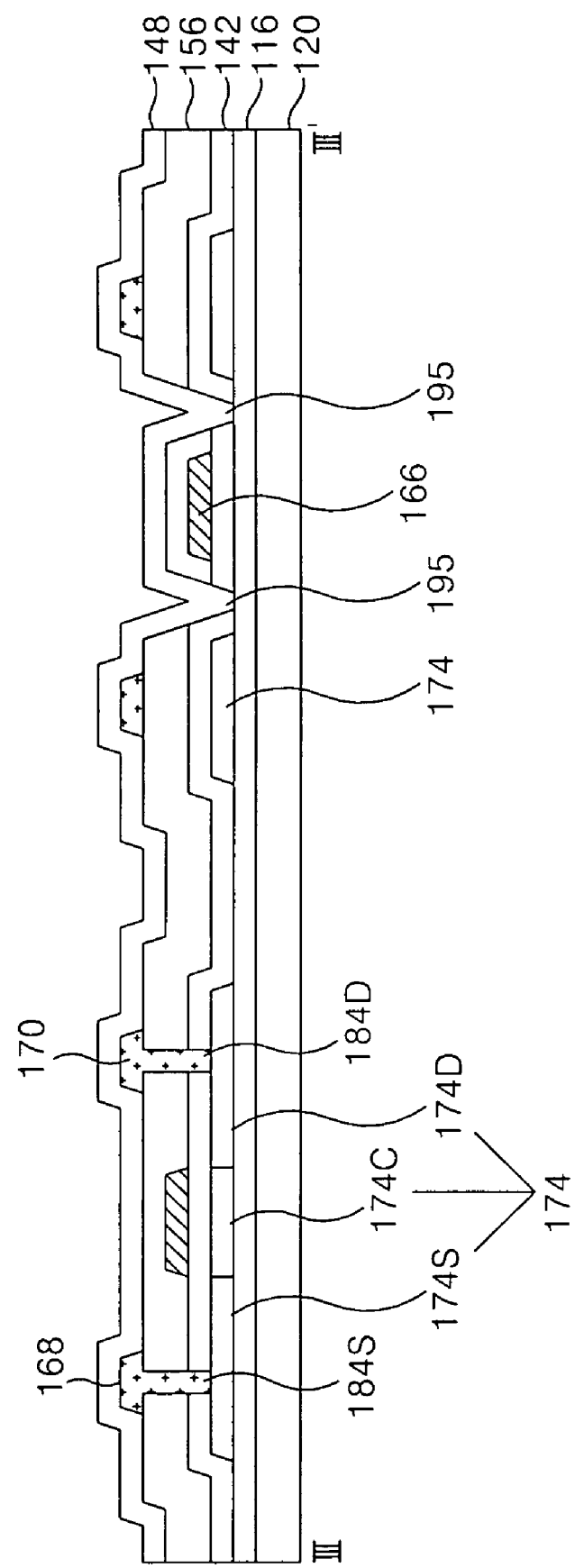

The insulating material of SiNx having the heat conductivity of about 16 to 22 W/mK is deposited over the entire surface of the lower substrate where the source and drain electrodes 168 and 170 have been formed, respectively, thereby forming the protective film 148 that is in contact with the buffer film 116 through the penetrating hole 195, as shown in FIG. 16E.

In this way, the liquid crystal display device and the fabricating method thereof according to the present invention have the protective film 148, of which the heat conductivity is high, formed between the channels in the driving device of the driving circuit. Accordingly, the heat generated as excessive current flows in the channel 177, is transmitted through the protective film 148, and then is radiated to the outside of the driving device, thereby preventing the deterioration of the channel 177. As a result, the defect of the driving device can be prevented such that the flow of the current passing through the channel 177 becomes smooth and the characteristic of the driving device of the driving circuit part is sustained.

On the other hand, the structure that the protective film with high heat conductivity between the channels is formed can be easily applied to any driving device that requires a broad channel width for switching relatively high voltage, such as the output buffer of the driving circuit part.

As described above, the liquid crystal display device and the fabricating method thereof according to the present invention have the same channel width, but the gap between the channels is different in accordance with its location, in the driving device of the driving circuit. Alternatively, the liquid crystal display device and the fabricating method thereof according to the present invention have the same distance between channels, but the channel width is different in accordance with its location. Accordingly, the amount of heat generated in the channel is adjusted or the conduction and radiation of heat in the distance between channels are appropriately adjusted, thereby preventing the defect of the driving device such as the deterioration occurring in part of the driving device.

Further, the liquid crystal display device and the fabricating method thereof according to the present invention have the protective film with high heat conductivity between channels in the driving device of the driving circuit to make the heat, which is generated in the channel, easily radiated. Accordingly, the deterioration of the channel is prevented to enabling the flow of current to become smooth and the characteristic of the driving device to be sustained.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A liquid crystal display device, comprising:
    a driving device of a structure that a plurality of thin film transistor having a channel of poly silicon are connected in parallel, in a driving circuit, and
    wherein at least one of widths of the channels and distances between the adjacent channels is different in accordance with their location;
    wherein when the distance between the channels is uniform, the channel width is formed to be one of gradually broader as it goes from a central part of the driving device to the edge thereof, or when the channel width is uniform, the distance between the channels is formed to be gradually narrower as it goes from a central part of the driving device to the edge thereof.

2. The liquid crystal display device according to claim 1, wherein the driving device comprises:
    an active layer formed to have a plurality of channels on a buffer film that is formed on a substrate;
    a gate electrode formed to overlap with the active layer and a gate insulating film therebetween; and
    a source electrode and a drain electrode being in contact with the active layer with the gate electrode and an intermediate insulating film therebetween.

3. A fabricating method of a liquid crystal display device, comprising:
    forming in a driving circuit a driving device of a structure that a plurality of thin film transistors are connected in parallel, wherein the thin film transistor has a channel of poly silicon; and
    forming at least one of the widths of the channels and distances of the channels in accordance with their location
    wherein when the distance between the channels is uniform, the channel width is formed to be gradually broader as it goes from a central part of the driving device to the edge thereof, or when the channel width is uniform, the distance between the channels is formed to be gradually narrower as it goes from a central part of the driving device to the edge thereof.

4. The fabricating method according to claim 3, wherein forming the driving device comprises:
    forming an active layer having a plurality of channels on a buffer film which is formed on a substrate;
    forming a gate electrode to overlap with the active layer and a gate insulating film therebetween; and
    forming a source electrode and a drain electrode being in contact with the active layer with the gate electrode and an intermediate insulating film therebetween.

* * * * *